(12) United States Patent
Yamada et al.

(10) Patent No.: US 10,886,001 B2
(45) Date of Patent: Jan. 5, 2021

(54) SEMICONDUCTOR-PRODUCT TESTING DEVICE, METHOD FOR TESTING SEMICONDUCTOR PRODUCT, AND SEMICONDUCTOR PRODUCT

(71) Applicant: RENESAS ELECTRONICS CORPORATION, Tokyo (JP)

(72) Inventors: Naoki Yamada, Tokyo (JP); Yoshiyuki Matsumoto, Tokyo (JP); Kazuhiro Nishimura, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 14 days.

(21) Appl. No.: 16/361,939

(22) Filed: Mar. 22, 2019

(65) Prior Publication Data

US 2019/0311776 A1  Oct. 10, 2019

(30) Foreign Application Priority Data

Apr. 9, 2018 (JP) .................. 2018-075000

(51) Int. Cl.
*G11C 29/00* (2006.01)
*G11C 29/38* (2006.01)
*G11C 29/36* (2006.01)

(52) U.S. Cl.
CPC .............. *G11C 29/38* (2013.01); *G11C 29/36* (2013.01)

(58) Field of Classification Search
CPC ........................... G11C 29/36; G11C 29/38
See application file for complete search history.

(56) References Cited

U.S. PATENT DOCUMENTS 5,331,643 A * 7/1994 Smith ............ G01R 31/318385
714/724
2012/0131399 A1* 5/2012 Henrion ................. G11C 29/26
714/723

FOREIGN PATENT DOCUMENTS

JP  2005-149170 A  6/2005

* cited by examiner

*Primary Examiner* — Samir W Rizk
(74) *Attorney, Agent, or Firm* — McDermott Will & Emery LLP

(57) ABSTRACT

A semiconductor-product testing device that supplies a test pattern for testing a semiconductor product to the semiconductor product includes a pattern memory that stores a part of the test pattern. The pattern memory is rewritten during a time when the semiconductor product is tested by a part of the test pattern stored in the pattern memory included in the semiconductor-product testing device.

12 Claims, 15 Drawing Sheets

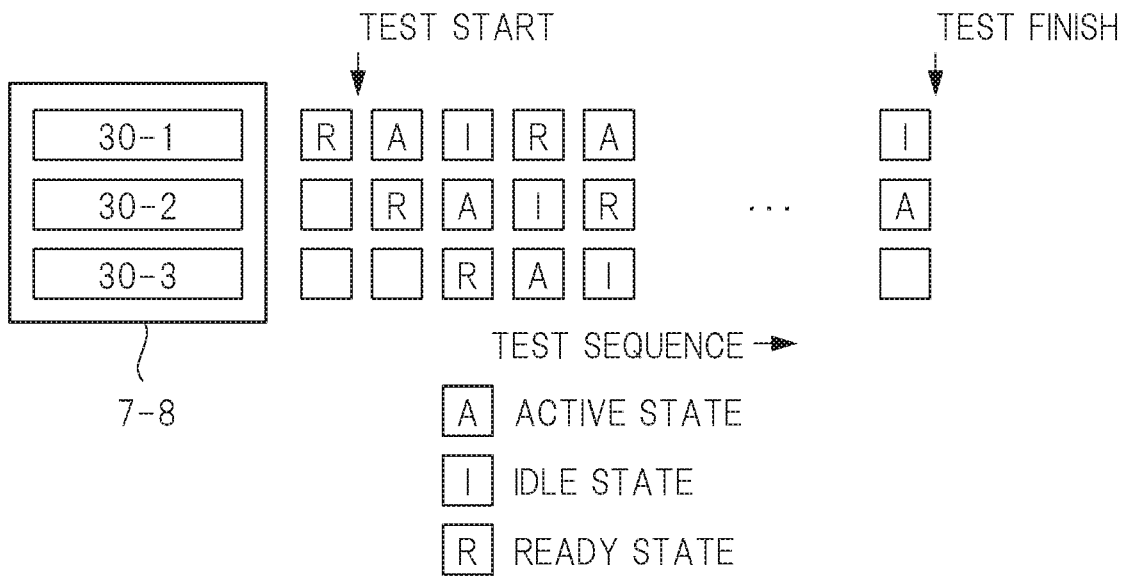
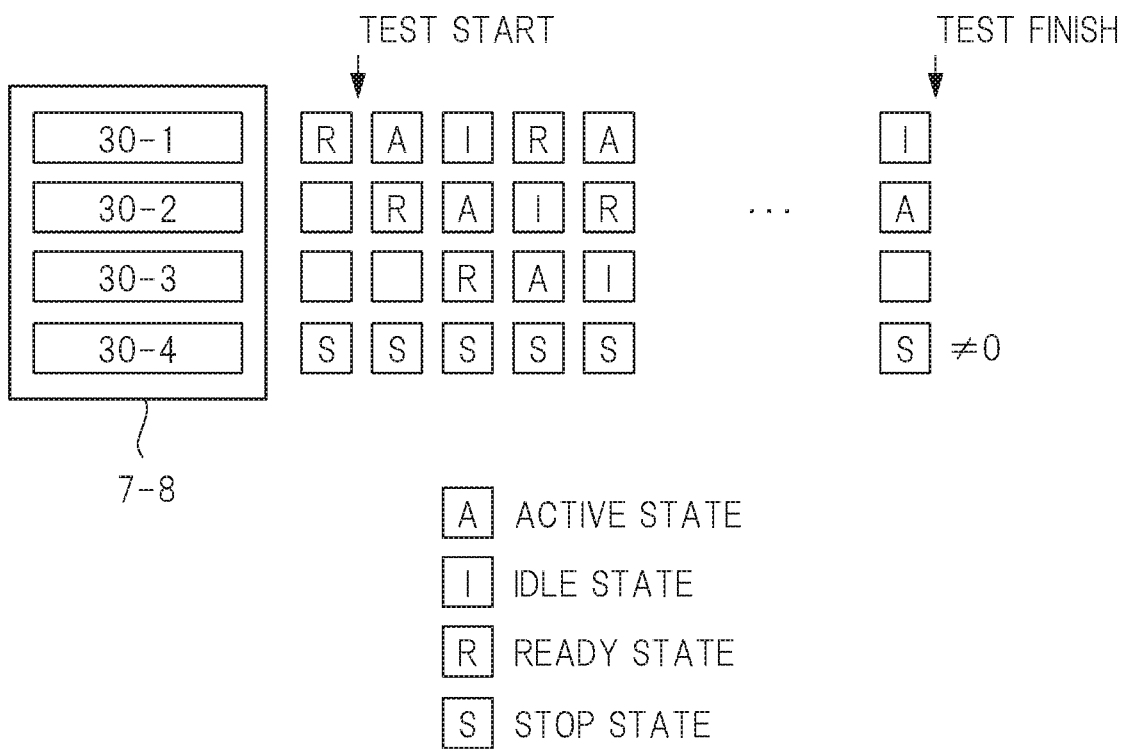

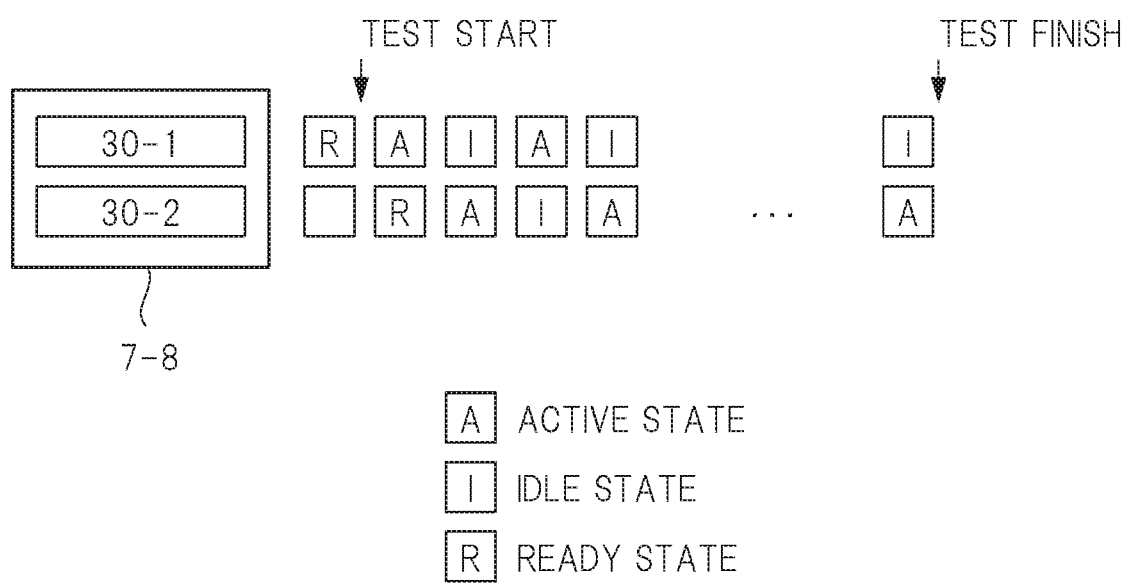

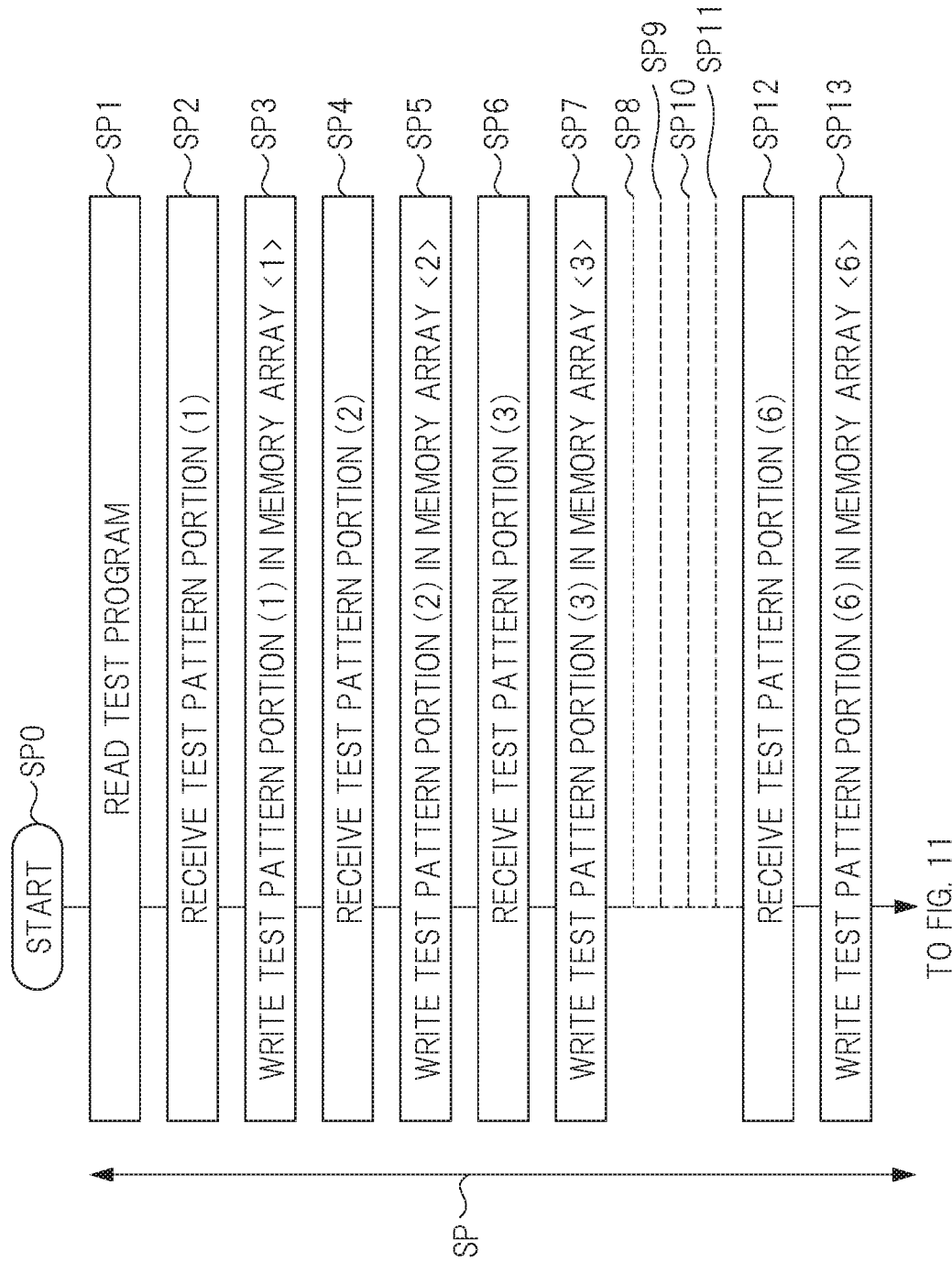

SEMICONDUCTOR-PRODUCT TESTING DEVICE, METHOD FOR TESTING SEMICONDUCTOR PRODUCT, AND SEMICONDUCTOR PRODUCT

CROSS-REFERENCE TO RELATED APPLICATION

The present application claims priority from Japanese Patent Application No. 2018-075000 filed on Apr. 9, 2018, the content of which is hereby incorporated by reference into this application.

TECHNICAL FIELD OF THE INVENTION

The present invention relates to a semiconductor-product testing device, a method for testing a semiconductor product, and a semiconductor product, and relates to a semiconductor-product testing device and a method for testing a semiconductor product, which are used to test a semiconductor product required to have high reliability for use in, for example, automobiles and industrial applications.

BACKGROUND OF THE INVENTION

A semiconductor-product testing device that tests a semiconductor product includes, for example, a pattern memory and a fail memory. Here, the pattern memory stores pattern data that is inputted into a semiconductor product at the time of testing and expected pattern data that is expected to be outputted from the semiconductor product when the pattern data is inputted into the semiconductor product. In addition, the fail memory stores pattern comparison data obtained by comparing the expected pattern data with output data that is outputted from the semiconductor product by inputting the pattern data into the semiconductor product.

If no fault location exists in a semiconductor product, the semiconductor product outputs the output data that is the same as the expected pattern data, when the pattern data is inputted into the semiconductor product. Thus, by checking the pattern comparison data stored in the fail memory, it is possible to identify the presence of fault and the location of fault in the semiconductor product.

Japanese Patent Application Laid-open Publication No. 2005-149170 (Patent Document 1) describes a testing system for testing a semiconductor product.

SUMMARY OF THE INVENTION

The miniaturization of semiconductor manufacturing process for manufacturing semiconductor products has been progressing in accordance with a so-called Moore's law. The miniaturization leads to an increase in the number of transistors mounted in the semiconductor product. In order to keep the fault coverage of semiconductor products to a certain level even if the number of transistors increases, it is necessary to increase the data amount of the pattern data and the expected pattern data. This also increases the data capacity of the pattern memory that stores the pattern data and the expected pattern data. In order to reduce the testing time required for testing semiconductor products, the pattern memory is configured of a high-speed static-type memory (hereinafter, also referred to as "SRAM"). However, since the high-speed SRAM is expensive, the increase in the data capacity of the pattern memory leads to an increase in the price of semiconductor-product testing devices.

Furthermore, the data amount of the pattern data and the expected pattern data depends on the fault coverage of semiconductor products. In other words, as the fault coverage increases, the data amount of the pattern data and the expected pattern data increases. For example, as compared with semiconductor products for general consumer applications, semiconductor products for automobile or industrial applications are required to have higher reliability. Thus, tests that can achieve high fault coverage are performed to the semiconductor products for automobile or industrial applications. In this case, the data amount of the pattern data and the expected pattern data is larger by approximately an order of magnitude or more as compared with tests performed to semiconductor products for general consumer applications. This leads to a further increase in the data capacity of the pattern memory for a semiconductor testing device directed to semiconductor products for which higher reliability is required, and also leads to a further increase in the price of the semiconductor testing device.

From the viewpoint of reducing the testing time, it may be considered that the transfer rate of pattern data supplied to a semiconductor product is increased at the time of the test to speed up the operation of the semiconductor product as compared with the normal case. In this case, this speed-up increases the power consumption of the semiconductor product, and also increases the amount of heat generated. Thus, the operable speed of the semiconductor product is limited on the basis of the temperature limit value at which the stability of the characteristics of the transistors constituting the semiconductor product is guaranteed. In other words, the transfer rate (clock frequency) of the pattern data has a certain upper limit based on the temperature limitation value of the semiconductor product. For example, the existing semiconductor-product testing device can only use pattern data at a transfer rate of several tens megahertz to several hundred megahertz.

Furthermore, at the time of test, the pattern data and the output data of the semiconductor product are transferred between the semiconductor-product testing device and the inside of the semiconductor product through the finite number of input-output pins of the semiconductor product. The number of input-output pins that can be disposed in the semiconductor product is determined according to the size of the semiconductor product, but the size of the semiconductor product is desired to be reduced in order to reduce the price. If the data amount of pattern data or/and output data increases in a state where the size of the semiconductor product is reduced, it takes time to transfer the pattern data or/and output data between the semiconductor-product testing device and the inside of the semiconductor product, which results in a longer testing time.

As to the increase in the data amount of the pattern data and the expected pattern data, for example, it may be considered to increase the number of pattern memories provided in the semiconductor-product testing device. In this case, however, it is necessary to additionally provide a costly high-speed SRAM such that the data capacity of the pattern memory has a capacity value exceeding the increase in the data amount of the pattern data and the expected pattern data. This leads to an increase in the cost of the semiconductor-product testing device, causing a problem of increased cost of testing of semiconductor products.

It may be possible to consider that the pattern data is compressed and the compressed pattern data is inputted into the semiconductor product at the time of test. In this case, if configured to supply the compressed pattern data also to the semiconductor-product testing device, it is possible to suppress the data capacity of the pattern memory that stores the pattern data. In addition, it is also possible to suppress the data amount transferred between the semiconductor-product testing device and the inside of the semiconductor product. In this case, however, an expansion circuit that expands the compressed pattern data that has been inputted or a self-generating circuit that generates pattern data on the basis of the compressed pattern data needs to be provided within the semiconductor product. This causes a problem of increased cost of the semiconductor product.

Furthermore, it may be considered that one pattern data is divided into a plurality of pattern data portions, the divided pattern data portions are inputted into the semiconductor product, and the semiconductor product is tested for each of the pattern data portions. In this case, if the pattern memory of the semiconductor-product testing device has a sufficient data capacity to store the pattern data portions, it is possible to execute a test based on the pattern data portions, and hence, it is possible to reduce the increase in the data capacity of the pattern memory. However, in the case where a test based on each of the pattern data portions is performed to the semiconductor product for the plurality of pattern data portions, the test needs to be performed plural times, so that it is necessary to take a testing setup time for setting up a test for the semiconductor product between the plural tests. This results in an increase in the testing time, and causes a problem of deteriorated productivity.

The testing setup time described here arises, for example, when a defective semiconductor product is extracted in a test based on the pattern data portions in the case where a plurality of semiconductor products are tested at the same time. In other words, when a defective semiconductor product is present, a process of removing the defective semiconductor product from the plurality of semiconductor products is carried out, and a new pattern data portion is then inputted into the remaining semiconductor products. Thus, a process to remove the defective semiconductor product and input a new pattern data portion into the remaining semiconductor products takes place. These periods of time for removing the defective semiconductor product and inputting a new pattern data portion correspond to the testing setup time.

Patent Document 1 describes a testing system for semiconductor integrated circuits, which includes a host computer and a plurality of testing devices. However, in Patent Document 1, the problems described above are not recognized.

Other problems and novel features will be made clear from the following descriptions in this specification and accompanied drawings.

A semiconductor-product testing device according to one embodiment is as follows.

Namely, a semiconductor-product testing device that supplies a test pattern for testing a semiconductor product to the semiconductor product includes a pattern memory that stores part of the test pattern, and the pattern memory is rewritten during a time when the semiconductor product is tested using the part of the test pattern stored in the pattern memory.

According to one embodiment, it is possible to provide a semiconductor-product testing device that can suppress an increase in price even if the data amount of pattern data increases.

BRIEF DESCRIPTIONS OF THE DRAWINGS

FIG. 7 is a diagram illustrating a state transition of a pattern memory according to the first embodiment;

FIG. 8 is a diagram illustrating a state transition of the pattern memory according to the first embodiment;

FIG. 9 is a diagram illustrating a state transition of the pattern memory according to the first embodiment;

FIG. 10 is a flowchart diagram illustrating a pre-test sequence according to the first embodiment;

DESCRIPTIONS OF THE PREFERRED EMBODIMENTS

Figure 1:
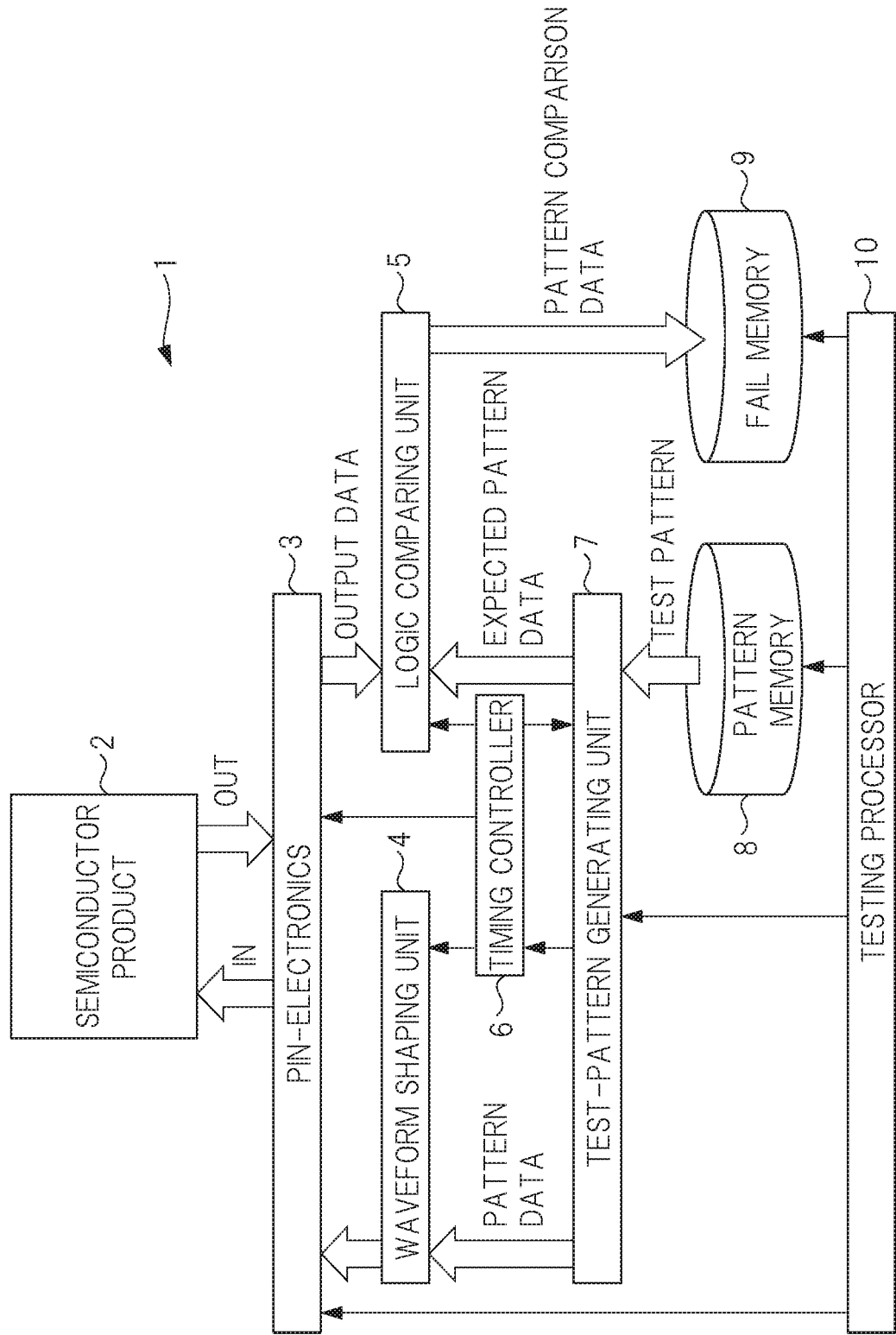
FIG. 1 is a block diagram illustrating a configuration of a semiconductor-product testing device according to a first embodiment.

Hereinafter, each embodiment according to the present invention will be described with reference to the drawings. Note that the disclosure is merely an example, and any appropriate changes that a person skilled in the art can easily reach within the gist of the present invention are of course included in the scope of the present invention. In addition, in order to clarify description, the drawings may be presented in a schematic manner in terms of the width, the thickness, the shape, and the like of each portion in comparison with the actual mode. However, these drawings are merely examples, and are not intended to limit the interpretation of the present invention.

Furthermore, in this specification and each of the drawings, the same reference characters are attached to elements similar to those that have been already described with reference to the drawings that have been already presented, and detailed description thereof may not be repeated as appropriate.

First Embodiment

<Configuration of Semiconductor-Product Testing Device>

FIG. 1 is a block diagram illustrating a configuration of a semiconductor-product testing device according to a first embodiment. For the purpose of description, a semiconductor product 2, which is to be tested using the semiconductor-product testing device (hereinafter, also simply referred to as a "testing device") 1, is also illustrated in the drawing. However, the configuration except for this semiconductor product 2 corresponds to the testing device 1.

As will be described later with reference to FIG. 2, the testing device 1 is connected to a testing server, and various data are transmitted and received between the testing server and the testing device 1. The data supplied from the testing server to the testing device 1 include pattern data and expected pattern data. Hereinbelow, in this specification, the pattern data and the expected pattern data are also collectively referred to as a test pattern. In addition, although no particular limitation is imposed, control data for controlling the testing device 1 is also supplied from the testing server to the testing device 1. On the other hand, data supplied from the testing device 1 to the testing server include pattern comparison data.

As illustrated in FIG. 1, the testing device 1 includes a pin-electronics 3, a waveform shaping unit 4, a logic comparing unit 5, a timing controller 6, a test-pattern generating unit 7, a pattern memory 8, a fail memory 9, and a testing processor 10. The test pattern supplied from the testing server (not illustrated) is stored in the pattern memory 8, and the pattern comparison data stored in the fail memory 9 is supplied from the testing device 1 to the testing server. In addition, the control data from the testing server is supplied to the testing processor 10. The testing processor 10 controls the pin-electronics 3, the test-pattern generating unit 7, the pattern memory 8, and the fail memory 9 such that the testing device 1 operates in accordance with the supplied control data.

The test pattern stored in the pattern memory 8 is supplied to the test-pattern generating unit 7. The test-pattern generating unit 7 generates the pattern data and the expected pattern data on the basis of the supplied test pattern. In addition, the test-pattern generating unit 7 generates control data for controlling the timing controller 6. The timing controller 6 outputs a timing signal for operating the waveform shaping unit 4, the logic comparing unit 5, and the test-pattern generating unit in accordance with the control data from the test-pattern generating unit 7.

The pattern data generated by the test-pattern generating unit 7 is supplied to the waveform shaping unit 4. The waveform shaping unit 4 shapes the waveform of the supplied pattern data and supplies the shaped pattern data to the pin-electronics 3. In addition, the expected pattern data generated by the test-pattern generating unit 7 is supplied to the logic comparing unit 5. The logic comparing unit 5 logically compares (compares logical values) between the output data outputted from the pin-electronics 3 and the expected pattern data, and supplies the pattern comparison data that has been obtained through the comparison to the fail memory 9. The fail memory 9 stores this supplied pattern comparison data.

The pin-electronics 3 supplies the supplied pattern data to the semiconductor product 2, and operates the semiconductor product 2 in accordance with the pattern data. The semiconductor product 2 is operated in accordance with the inputted pattern data to form the output data corresponding to the pattern data, and outputs it to the pin-electronics 3. The pin-electronics 3 supplies the supplied output data to the logic comparing unit 5.

In the logic comparing unit 5, logical comparison is performed between the expected pattern data and the output data from the semiconductor product 2, and the result thereof is stored in the fail memory 9 as the pattern comparison data. If the semiconductor product 2 has a fault, the fault location can be identified by referencing the pattern comparison data that has been supplied from the fail memory 9, in the testing server.

Note that, although no particular limitation is imposed, the semiconductor product 2 is a semiconductor product used in automobile or industrial applications where reliability is required. For example, a processor used in automobiles serves as the semiconductor product 2, and is tested by the testing device 1.

<Testing Server and Testing Device>

Next, a relationship between the testing server and the testing device 1 will be described. Here, description will be made on the assumption that the testing system is configured of the testing server and the testing device 1. FIG. 2 is a schematic view illustrating a configuration of the testing system according to the first embodiment. Here, description will be made by using a testing system 20 in a semiconductor factory where semiconductor products are manufactured as an example, but the present invention is of course not limited to this.

Figure 2:
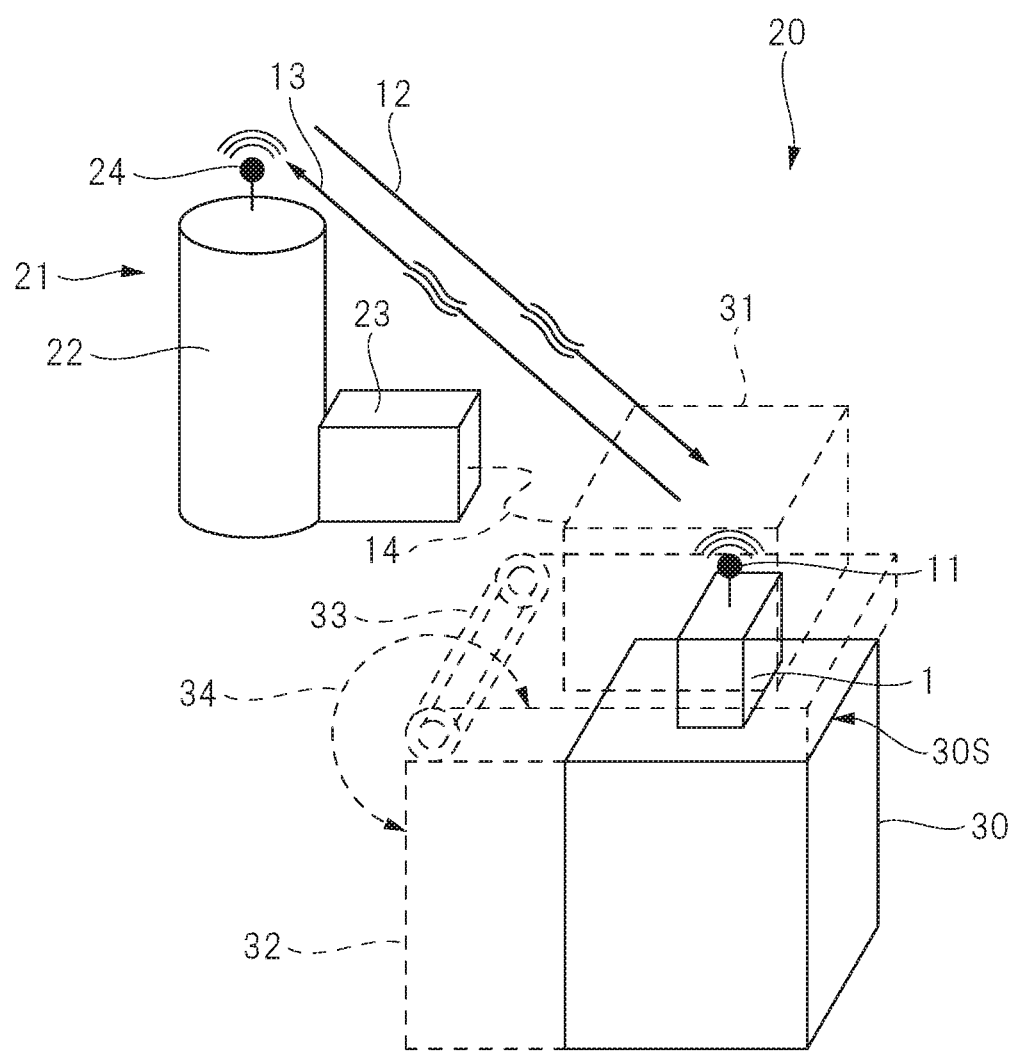
FIG. 2 is a schematic view illustrating a configuration of a testing system according to the first embodiment.

In FIG. 2, 21 represents a testing server disposed in the semiconductor factory. The testing server 21 is connected to a plurality of testing devices installed in the semiconductor factory, and controls the plurality of testing devices by transmitting and receiving various types of data with the plurality of testing devices. In other words, the plurality of testing devices are controlled by the common testing server 21. In addition, although no particular limitation is imposed, the testing server 21 and the plurality of testing devices are connected in wired and wireless manners. Of course, the testing server 21 and the plurality of testing devices may be connected only in a wired manner or only in a wireless manner. FIG. 2 illustrates only one testing device of the plurality of testing devices as an example.

The testing device 1 illustrated in FIG. 2 is a testing device for testing a semiconductor wafer on which a plurality of semiconductor chips (semiconductor products) are formed. In other words, the testing device 1 is used to test a plurality of semiconductor chips formed on a semiconductor wafer. In FIG. 2, 30 represents a mounting stage of a manipulator wafer prober. In the manipulator wafer prober, a mounting portion 32 indicated by dashed lines is attached to the mounting stage 30, and the mounting portion 32 and a lid portion 31 are connected with a rotary movable part 33. The movable part 33 rotates in a direction indicated by an arrowed dashed line 34 to bring the lid portion 31 into an opened state or closed state with respect to a main surface 30S of the mounting stage 30. The testing device 1 is disposed on the lid portion 31. By placing a semiconductor wafer (not illustrated) on the main surface 30S of the mounting stage 30 and closing the lid portion 31, the testing device 1 is brought into electrical contact with the plurality of semiconductor chips formed on the semiconductor wafer. Since the testing device 1 according to the first embodiment is brought into electrical contact with a semiconductor chip to be tested, the testing device 1 may be regarded as a test head portion.

The testing device 1 includes a wireless antenna 11. Although no particular limitation is imposed, the test pattern described above is received as a wireless signal 12 by the wireless antenna 11, and is supplied to the pattern memory 8 (FIG. 1) in the testing device 1. In addition, the pattern comparison data stored in the fail memory 9 (FIG. 1) is converted into a wireless signal 13, and is transmitted by the wireless antenna 11.

The testing server 21 includes a testing memory server 22 and a testing device controller 23. The testing memory server 22 includes a wireless antenna 24. The testing memory server 22 according to the first embodiment stores a test pattern, and the stored test pattern is converted into a wireless signal 12 and is transmitted by the wireless antenna 24. On the other hand, the wireless signal 13 of the pattern comparison data received by the wireless antenna 24 is converted into a digital signal, and is stored in the testing memory server 22. Namely, the test pattern and the pattern comparison data described above are transmitted and received wirelessly between the testing device 1 and the testing memory server 22.

On the other hand, the testing processor 10 (FIG. 1) in the testing device 1 transmits and receives data to and from the testing device controller 23 through a wired bus 14 indicated by a dashed line in FIG. 2. Of course, transmission and reception of data may be performed wirelessly between the testing processor 10 and the testing device controller 23. In addition, instead of the wireless signals 12 and 13, wired signals may be adopted to transmit and receive the test pattern and the pattern comparison data between the testing memory server 22 and the testing device 1.

However, if configured to transmit and receive the test pattern and the pattern comparison data wirelessly, it is possible to reduce the number of wired lines (cables) that connect between the testing memory server 22 and the testing device 1. As a result, it is possible to prevent the weight of the testing device 1 from increasing due to the cables. The reduction in the weight of the testing device 1 makes it easy to open and close the lid portion 31. In addition, the reduction in the weight of the testing device 1 makes it possible to reduce the load applied to the semiconductor wafer, which makes it possible to reduce occurrence of fault in the semiconductor wafer or/and the testing device 1.

In FIG. 2, the swung dashes attached to the wireless signals 12 and 13 indicate that there are a plurality of channels for each of the wireless signals. In other words, the test pattern is transmitted in parallel through a plurality of channels from the testing memory server 22 to the testing device 1. Similarly, the pattern comparison data is also transmitted through a plurality of channels from the testing device 1 to the testing memory server 22.

The testing memory server 22 according to the first embodiment divides one test pattern into a plurality of test pattern portions to transmit them. At this time, the testing memory server 22 transmits ordering information indicating the temporal order of the divided test pattern portions and division-number information indicating the number of division, as pattern information, although no particular limitation is imposed. For example, in the case where one test pattern is divided into seven test pattern portions, the testing memory server 22 divides one test pattern such that a test pattern portion that is the earliest in time serves as a test pattern portion (1), a test pattern portion that is the next earliest in time serves as a test pattern portion (2), and subsequently a test pattern portion that is the latest in time serves as a test pattern portion (7). At this time, the numeric values (1) to (7) attached to the test pattern portions serve as the ordering information. In addition, the testing memory server 22 transmits seven, which is the number of division, as the division-number information. As described above, in this specification, the pattern data and the expected pattern data are collectively referred to as the test pattern. Thus, each of the test pattern portions includes the pattern data portion and the expected pattern data portion. For example, the test pattern portion (1) includes a pattern data portion (1) and an expected pattern data portion (1), and the test pattern portion (2) includes a pattern data portion (2) and an expected pattern data portion (2).

Similarly, the testing device 1 divides one pattern comparison data into a plurality of pattern comparison data portions to transmit them. In this case, the testing device 1 transmits the ordering information indicating the temporal order. In the first embodiment, a pattern comparison data portion that is the earliest in time is set as a pattern comparison data portion (1), the next pattern comparison data portion is set as a pattern comparison data portion (2), and subsequently, the ordering information is added after the pattern comparison data portions in the same manner, and then, the testing device 1 transmits them.

Of course, the ordering information and the division-number information described above are merely examples, and the present invention is not limited to them. Next, operations of the testing device 1 using the divided test pattern portions and the divided pattern comparison data portions will be described with reference to the drawings.

<Operation of Testing Device>

Figure 3:
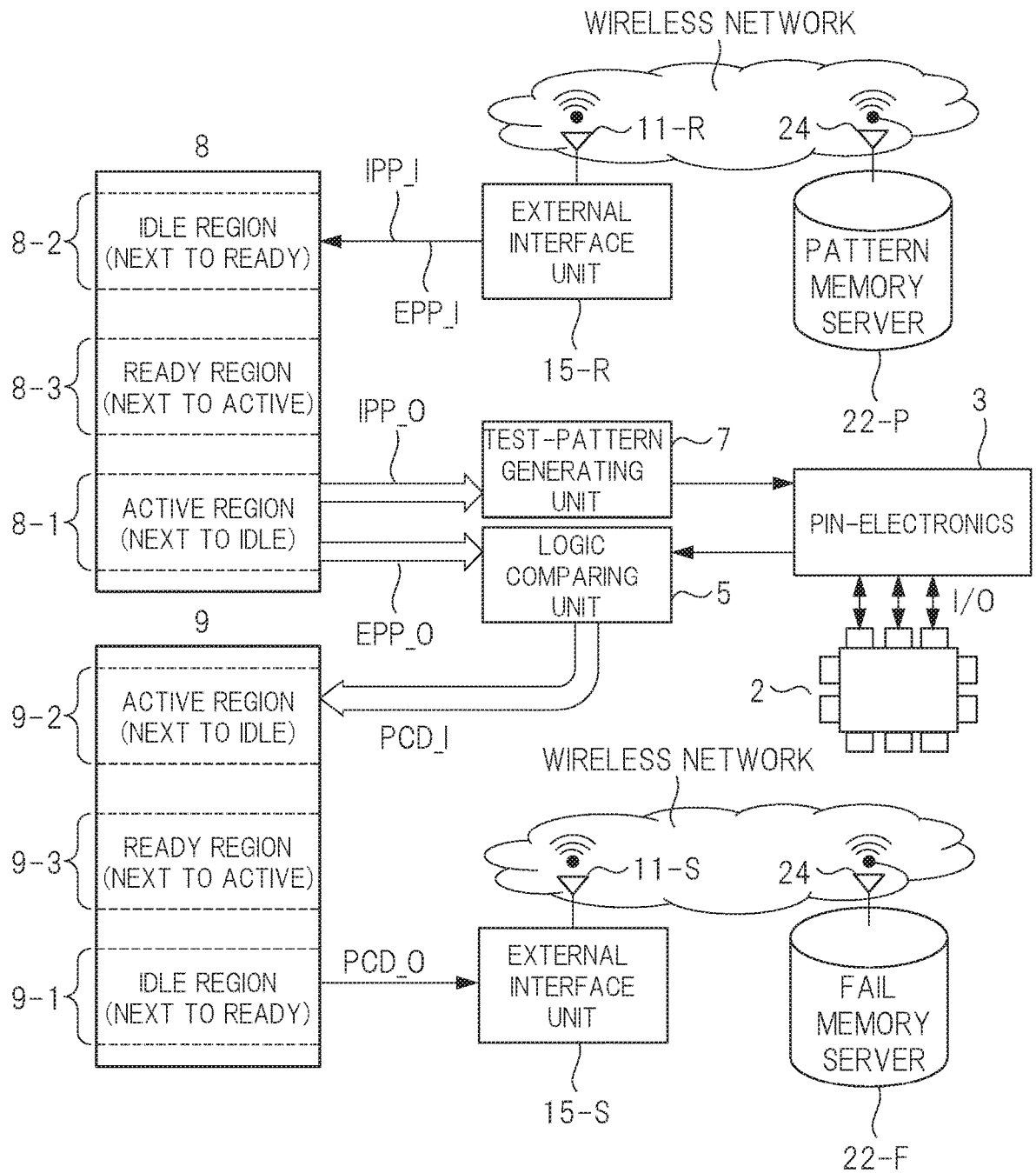
FIG. 3 is an explanatory view for describing an operation of a testing device according to the first embodiment.

FIG. 3 is an explanatory view for describing the operation performed by the testing device according to the first embodiment. In the testing device 1 according to the first embodiment, the pattern memory 8 and the fail memory 9 are each divided into a plurality of address regions. Here, a case in which the pattern memory 8 and the fail memory 9 are each divided into three address regions will be described as an example.

In this drawing, 8-1 represents an address region (hereinafter, also referred to as a first address region) that has a predetermined size in the pattern memory 8. In addition, 8-2 represents an address region (hereinafter, also referred to as a second address region) that is different from the address region 8-1 and has a predetermined size in the pattern memory 8, and 8-3 represents an address region (hereinafter, also referred to as a third address region) that is different from the address regions 8-1 and 8-2 and has a predetermined size in the pattern memory 8.

Each of the address regions 8-1 to 8-3 is configured to have a size (predetermined size) that can store one divided test pattern portion (a pattern data portion and an expected pattern data portion).

Furthermore, in FIG. 3, 9-1 represents an address region (hereinafter, also referred to as a first address region) that has a predetermined size in the fail memory 9. In addition, 9-2 represents an address region (hereinafter, also referred to as a second address region) that is different from the address region 9-1 and has a predetermined size in the fail memory 9, and 9-3 represents an address region (hereinafter, also referred to as a third address region) that is different from the address regions 9-1 and 9-2 and has a predetermined size in the fail memory 9. Each of the address regions 9-1 to 9-3 is configured to have a size (predetermined size) that can store one divided pattern comparison data portion.

For the convenience of description, the testing memory server 22 includes a pattern memory server 22-P that stores the test pattern and a fail memory server 22-F that stores the pattern comparison data. The pattern memory server 22-P divides the test pattern stored therein, and wirelessly transmits the test pattern portions obtained through the division in a temporal order of the division. The test pattern portions that have been wirelessly transmitted are received through the Internet, cloud, or other wireless networks by a wireless antenna 11-R of the testing device 1. In the testing device 1, the received test pattern portions are converted into binary logical signals by an external interface unit 15-R, and are then outputted. In FIG. 3, the test pattern portions outputted from the external interface unit 15-R are illustrated as a pattern data portion IPP_I and an expected pattern data portion EPP_I.

The testing processor 10 (FIG. 1) manages three address regions 8-1 to 8-3 as an active region (Active), a ready region (Ready), and an idle region (Idling). Here, the active region is an address region where the pattern data portion and the expected pattern data portion, each of which has been stored therein, are outputted as a pattern data portion IPP_O and an expected pattern data portion EPP_O. When output of the stored pattern data portion and expected pattern data portion from the active region has been finished, the testing processor 10 transits the active region into the idle region.

The ready region is a region where the pattern data portion and the expected pattern data portion are stored. When the active region transits into the idle region, the testing processor 10 transits the ready region into the active region, and causes the stored pattern data portion and expected pattern data portion to be outputted as a pattern data portion IPP_O and an expected pattern data portion EPP_O.

Furthermore, the idle region is a region where the pattern data portion IPP_I and the expected pattern data portion EPP_I are being written. When the writing is finished, the testing processor 10 transits this idle region into the ready region.

The testing processor 10 manages the address regions 8-1 to 8-3 described above by referencing the ordering information such that test pattern portions are supplied to the test-pattern generating unit 7 and the logic comparing unit 5 in the order from the earliest test pattern portion in time.

This drawing illustrates a state in which the address region 8-1 is the active region, the address region 8-3 is the ready region, and the address region 8-2 is the idle region. In this case, the test pattern portion stored in the address region 8-1 serving as the active region is supplied to the test-pattern generating unit 7 and the logic comparing unit 5 as the pattern data portion IPP_O and the expected pattern data portion EPP_O. During the time when test pattern portion stored in the address region 8-1 is being outputted, a pattern data portion IPP_I and an expected pattern data portion EPP_I, each of which is outputted from the external interface unit 15-R, are supplied to the address region 8-2 serving as the idle region, and the test pattern portion is stored in the address region 8-2. During this period of time, the address region 8-3 serving as the ready region is on standby in a state of retaining a test pattern portion to be outputted next.

With the pattern data portion IPP_O being supplied, the test-pattern generating unit 7 supplies input data corresponding to the supplied pattern data portion IPP_O to the pin-electronics 3. The pin-electronics 3 inputs data based on the supplied input data into the semiconductor product 2. The semiconductor product outputs data corresponding to the inputted data to the pin-electronics 3. The pin-electronics 3 outputs output data based on the data from the semiconductor product 2 to the logic comparing unit 5.

The logic comparing unit 5 compares the supplied output data with the expected pattern data portion EPP_O supplied from the address region 8-1, and outputs the result of comparison to the fail memory 9 as a pattern comparison data portion PCD_I.

The testing processor 10 manages the address regions 9-1 to 9-3 in the fail memory 9 as the active region, the ready region, and the idle region, as with the pattern memory 8. Here, the active region is an address region where the pattern comparison data portion PCD_I is being written. When the writing of the pattern comparison data portion PCD_I to this active region is finished, the testing processor 10 transits the active region into the idle region.

The ready region is a region where the pattern comparison data portion has been outputted, and is an address region that is on standby for the writing of the pattern comparison data portion. When the active region transits into the idle region, the testing processor 10 causes the ready region to transit into the active region.

The idle region is an address region where the stored pattern comparison data portion is being outputted as the pattern comparison data portion PCD_O. When the output of the pattern comparison data portion stored in the idle region is finished, the testing processor 10 causes the idle region to transit into the ready region. During the time when the pattern comparison data portion stored in this idle region is being outputted as the pattern comparison data portion PCD_O, a pattern comparison data portion PCD_I is written into the active region.

Note that the testing processor 10 adds the ordering information to the pattern comparison data portion PCD_O in a temporal order of the supply to the fail memory 9.

This drawing illustrates a state in which the address region 9-2 is the active region, the address region 9-3 is the ready region, and the address region 9-1 is the idle region. In this case, a pattern comparison data portion stored in the address region 9-1 serving as the idle region is supplied to the external interface unit 15-S as the pattern comparison data portion PCD_O. During the time when the pattern comparison data portion stored in the address region 9-1 is being outputted, a pattern comparison data portion PCD_I from the logic comparing unit 5 is supplied to the address region 9-2, and a pattern comparison data portion is stored in the address region 9-2. During this period of time, the address region 9-3 is on standby as the ready region.

The external interface unit 15-S converts the supplied pattern comparison data portion PCD_O into a wireless signal, and transmits it from the wireless antenna 11-S. The transmitted pattern comparison data portion PCD_O is received by the fail memory server 22-F through the Internet, cloud, or other wireless networks.

As described above, in the semiconductor-product testing device 1 according to the first embodiment, the pattern memory 8 is rewritten with a new test pattern portion from the pattern memory server 22-P, during the time when the stored test pattern portion is being outputted. Similarly, the fail memory 9 is rewritten with the pattern comparison data portion from the logic comparing unit 5, during the time when the pattern comparison data portion is being outputted. Therefore, semiconductor products can be tested with a pattern memory and a fail memory having a small capacity, even if the data amount of the test pattern and the pattern comparison data increases. Note that although an example in which different external interface units 15-R and 15-S are used for a case where the test pattern portion is received and a case where the pattern comparison data portion is transmitted has been described, it is also possible to use a common external interface unit. In this case, a common wireless antenna can be used for the wireless antennas 11-R and 11-S.

<Specific Configuration of Testing Device>

Next, more specific configuration of the testing device 1 will be described.

<<Testing System>>

Figure 4:
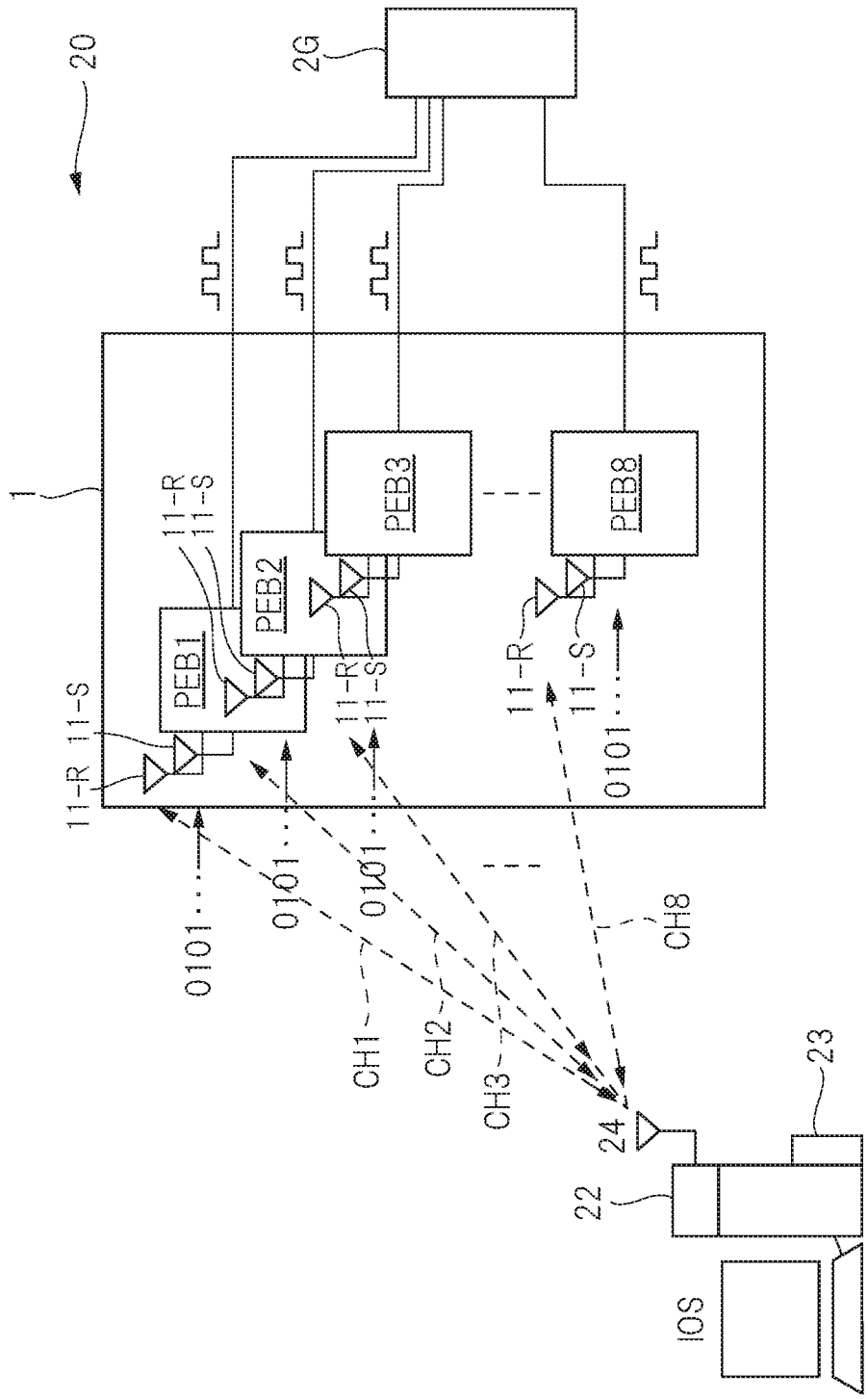
FIG. 4 is a block diagram illustrating a configuration of the testing system according to the first embodiment.

FIG. 4 is a block diagram illustrating a configuration of the testing system according to the first embodiment. The schematic configuration of the testing system 20 has been already described with reference to FIG. 2. Here, the relationship between the testing memory server 22 and the testing device 1, each of which constitutes the testing system 20, will be described more specifically.

In FIG. 4, IOS represents an input-output device that is connected to the testing memory server 22 and the testing device controller 23. An operator uses the input-output device IOS to operate the testing memory server 22 and the testing device controller 23 and also check the state of test.

The testing memory server 22 uses a plurality of wireless channels CH1 to CH8, which are different from each other, to transmit and receive a plurality of test pattern portions and a plurality of pattern comparison data portions between the testing memory server 22 and the testing device 1. This drawing illustrates binary logic array "0101 . . . " as an example of the test pattern portion wirelessly transmitted from the testing memory server 22 to the testing device 1.

The testing device 1 includes a plurality of pin-electronics boards (hereinafter, also referred to as a "testing board") PEB1 to PEB8. Each of the testing boards PEB1 to PEB8, which will be described later with reference to FIG. 5, has a function of the testing device 1 illustrated in FIG. 1 and a function of the external interface units 15-R and 15-S that have been described with reference to FIG. 3. Wireless channels CH1 to CH8 are allocated to the testing boards PEB1 to PEB8, respectively, and the allocated wireless channels are used to perform wireless data transfer between the testing boards and the testing memory server 22. For example, the wireless channel CH1 is allocated to the testing board PEB1, and the wireless channel CH1 is used to perform data transfer between the testing board PEB1 and the testing memory server 22.

Each of the testing boards PEB1 to PEB8 is to test a corresponding semiconductor product, although no particular limitation is imposed. In other words, each of the testing boards PEB1 to PEB8 outputs input data based on a pattern data portion of a test pattern portion transferred through an allocated wireless channel, to a corresponding semiconductor product. In addition, each of the testing boards PEB1 to PEB8 transmits, as a pattern comparison data portion, the result of comparison between the output data outputted from a corresponding semiconductor product and an expected pattern data portion of a transferred test pattern portion, to the testing memory server 22 using an allocated wireless channel.

For example, the number of semiconductor products to be tested at the same time can be increased by increasing the number of wireless channels and also increasing the number of testing boards. In addition, since one wireless channel is allocated to a semiconductor product, the amount of data transferred between the semiconductor product 2 and the testing board can be easily increased by increasing the amount of data transferred per unit time through the wireless channel. Note that, in FIG. 4, 2G represents a plurality of semiconductor products to be tested using the testing boards PEB1 to PEB8.

<<Testing Board>>

Figure 5:
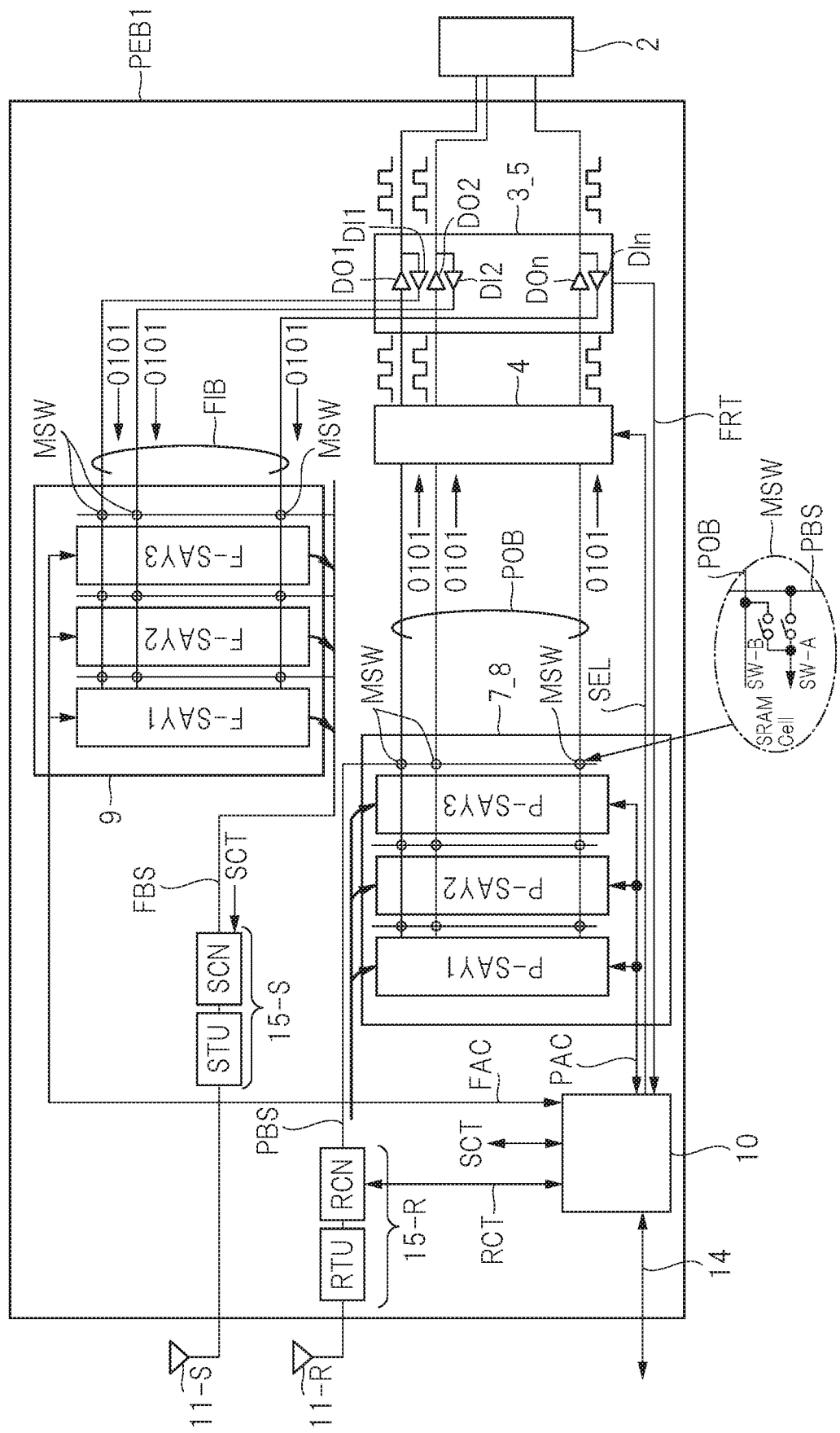
FIG. 5 is a block diagram illustrating a configuration of a testing board according to the first embodiment.

FIG. 5 is a block diagram illustrating a configuration of the testing board according to the first embodiment. Since each of the testing boards PEB1 to PEB8 has the same configuration, the testing board PEB1 will be described as an example.

In the testing board PEB1, the pattern memory has both functions of the pattern memory 8 and the test-pattern generating unit 7 illustrated in FIG. 1. Thus, in FIG. 5, the reference character of the pattern memory is denoted as 7_8, which is a combination of the reference characters of them.

The pattern memory 7_8 supplies the stored test pattern portions (the pattern data portion and the expected pattern data portion) as output of the test-pattern generating unit 7 to the waveform shaping unit 4 through a pattern output bus POB.

The pattern memory 7_8 includes three SRAM arrays P-SAY1 to P-SAY3. Here, description will be made of an example in which three SRAM arrays are provided. Of course, however, the number of the SRAM arrays is not limited to this. The plurality of SRAM arrays include a plurality of SRAM cells that are arranged in an array manner. Each of the SRAM arrays P-SAY1 to P-SAY3 is connected to the test pattern bus PBS and the pattern output bus POB through a plurality of switches MSW illustrated as circles in the drawing.

In FIG. 5, a specific configuration of one switch MSW is illustrated in a balloon. The switch MSW includes a switch SW-A that is connected between an input-output node and the test pattern bus PBS of the SRAM cell and a switch SW-B that is connected between the input-output node and the pattern output bus POB. The testing processor 10 causes the switch SW-A in the switch MSW to be in the on state and causes the switch SW-B to be in the off state when the test pattern portion is stored in the pattern memory 7_8. Meanwhile, the testing processor 10 causes the switch SW-A to be in the off state and causes the switch SW-B to be in the on state when the test pattern portion stored in the pattern memory 7_8 is outputted as the pattern data portion and the expected pattern data portion.

In this manner, when the test pattern portion is stored in the pattern memory 7_8, the input-output node of the SRAM cell is connected to the test pattern bus PBS through the switch SW-A, and the test pattern portion supplied through the test pattern bus PBS is written in the SRAM cell. On the other hand, when the switch SW-B is switched into the on state, the input-output node of the SRAM cell is connected to the pattern output bus POB, and hence, the test pattern portion stored in the pattern memory 7_8 is outputted as the pattern data portion and the expected pattern data portion through the pattern output bus POB to the waveform shaping unit 4.

The testing processor 10 outputs an address signal, a chip selection signal, and the like as a pattern-memory selection signal PAC to the pattern memory 7_8 in order to select an SRAM cell. One SRAM array is selected by the pattern-memory selection signal PAC from the three SRAM arrays P-SAY1 to P-SAY3, and a plurality of SRAM cells are selected from the selected SRAM array. When the test pattern portion is stored in the pattern memory 7_8, an input-output node of the selected SRAM cell is connected to the test pattern bus PBS through the switch MSW. In addition, when the pattern data portion and the expected pattern data portion are outputted from the pattern memory 7_8, the input-output node of the selected SRAM cell is connected to the pattern output bus POB through the switch MSW.

The external interface unit 15-R is connected to the test pattern bus PBS. Although no particular limitation is imposed, the external interface unit 15-R includes a converting unit RTU that performs conversion between a high-frequency wireless signal and a binary logic signal and an interface unit RCN that supplies the binary logic signal converted by the converting unit RTU as the test pattern portion to the test pattern bus PBS. With this configuration, the test pattern portion of the wireless signal received by the wireless antenna 11-R is converted into the binary logic signal, and is supplied to the test pattern bus PBS.

As described above, the pattern data portion and the expected pattern data portion are supplied to the pattern output bus POB from the pattern memory 7_8. The waveform shaping unit 4 has not only a function of shaping waveforms of the pattern data portion and the expected pattern data portion supplied through the pattern output bus POB and but also a function of separating the pattern data portion and the expected pattern data portion that have been supplied. The testing processor 10 designates whether data supplied to the waveform shaping unit 4 is a pattern data portion or an expected pattern data portion. In other words, the testing processor 10 uses a selection signal SEL to notify the waveform shaping unit 4 of whether the data is a pattern data portion or an expected pattern data portion.

When being notified by the selection signal SEL that the data is a pattern data portion, the waveform shaping unit 4 supplies the supplied data to a logic comparing unit 3_5 as a pattern data portion. On the other hand, when being notified by the selection signal SEL that the supplied data is an expected pattern data portion, the waveform shaping unit 4 supplies the supplied data to the logic comparing unit 3_5 as an expected pattern data portion.

The logic comparing unit 3_5 has both functions of the pin-electronics 3 and the logic comparing unit 5, each of which is illustrated in FIG. 1. Although no particular limitation is imposed, this logic comparing unit includes drivers DO1 to DOn and comparator circuits DI1 to DIn, the number of the drivers and the number of the circuits being the same number as the number of parallel signals in the pattern output bus POB.

The data supplied from the waveform shaping unit 4 as the pattern data portion is supplied to input nodes of the drivers DO1 to DOn. The output nodes of the drivers DO1 to DOn are in electrical contact with the external terminals of the semiconductor product 2. With this configuration, the pattern data portion is supplied to the semiconductor product 2, and the semiconductor product 2 operates in accordance with the supplied pattern data portion. The operation of the semiconductor product 2 causes the output data outputted from the external terminals of the semiconductor product 2 to be supplied to the first input nodes of the comparator circuits DI1 to DIn.

The logic comparing unit 3_5 supplies the data supplied as the expected pattern data portion to the second input nodes (not illustrated) of the comparator circuits DI1 to DIn. The comparator circuits DI1 to DIn perform logical comparison between the output data from the semiconductor product 2 and the expected pattern data, and output the result of comparison to a fail input bus FIB as the pattern comparison data portion. In addition, in the case where an inconsistency occurs in logical values between the first input node and the second input node in any of the comparator circuits DI1 to DIn, the logic comparing unit 3_5 notifies the testing processor 10 of the occurrence of fault using a fail signal FRT. Note that this drawing illustrates a case where common external terminals are used for both the external terminals in charge of input for the semiconductor product 2 and the external terminals in charge of output. However, the present invention is not limited to this.

Although no particular limitation is imposed, when being notified by the fail signal FRT that the fault occurs, the testing processor 10 notifies the testing device controller 23 of the occurrence of the fault through a wired bus 14. This notification is displayed on, for example, the input-output device IOS illustrated in FIG. 4 to notify an operator.

On the other hand, the pattern comparison data portion supplied to the fail input bus FIB is stored in the fail memory 9. Although no particular limitation is imposed, the fail memory 9 also includes three SRAM arrays F-SAY1 to F-SAY3 as with the pattern memory 7_8. Of course, the number of the arrays is not limited to this. In addition, it may be possible to adopt an array using a dynamic-type memory (DRAM) instead of the SRAM array.

The input-output nodes of the SRAM cells constituting the SRAM arrays F-SAY1 to F-SAY3 are connected to the fail input bus FIB and the fail memory bus FBS through the switch MSW as with the SRAM arrays P-SAY1 to P-SAY3. The configuration of the switch MSW has already been described, and hence, description thereof will not be repeated. The testing processor 10 outputs, from the SRAM arrays F-SAY1 to F-SAY3, a chip selection signal for designating an SRAM array, an address signal for designating a plurality of SRAM cells from the designated SRAM array, and the like as a fail-memory selection signal FAC.

The testing processor 10 selects a plurality of SRAM cells from the SRAM arrays F-SAY1 to F-SAY3 by the fail-memory selection signal FAC when a pattern comparison data portion is stored in the fail memory 9. At this time, the testing processor 10 controls the switch MSW such that the fail input bus FIB is connected to the input-output nodes of the plurality of selected SRAM cells. On the other hand, in the case where a pattern comparison data portion is outputted from the fail memory 9, the testing processor 10 controls the switch MSW such that the input-output nodes of the plurality of selected SRAM cells are connected to the fail memory bus FBS.

The external interface unit 15-S is connected to the fail memory bus FBS. This external interface unit 15-S includes a converting unit STU and an interface unit SCN as with the external interface unit 15-R. The interface unit SCU supplies the pattern comparison data portion supplied through the fail memory bus FBS to the converting unit STU. The converting unit STU converts the supplied pattern comparison data portion into a high-frequency wireless signal to transmit it by the wireless antenna 11-S.

The transmitted pattern comparison data portion is stored in the testing memory server 22. The operator can identify a fault location or the like by referencing the pattern comparison data portion stored in the testing memory server 22, for example, when occurrence of failure is displayed on the input-output device IOS.

Furthermore, the testing processor 10 controls the external interface units 15-R and 15-S by the control signals RCT and SCT. In addition, the testing processor 10 can transmit and receive data with the testing memory server 22 by using the external interface units 15-R and 15-S. Of course, the present invention is not limited to this, and the testing processor 10 can transmit and receive data with the testing memory server 22 by using either one of the external interface units 15-R and 15-S.

The testing processor 10 executes a program to output each of the signals described above. The program executed by the testing processor 10 is supplied from the testing device controller 23 (FIG. 2) through, for example, the wired bus 14.

<<Operation of Pattern Memory and Fail Memory>>

Next, operation of the pattern memory 7_8 and the fail memory 9 controlled by the testing processor 10 will be described.

<<<Operation of Pattern Memory>>>

Figure 6:
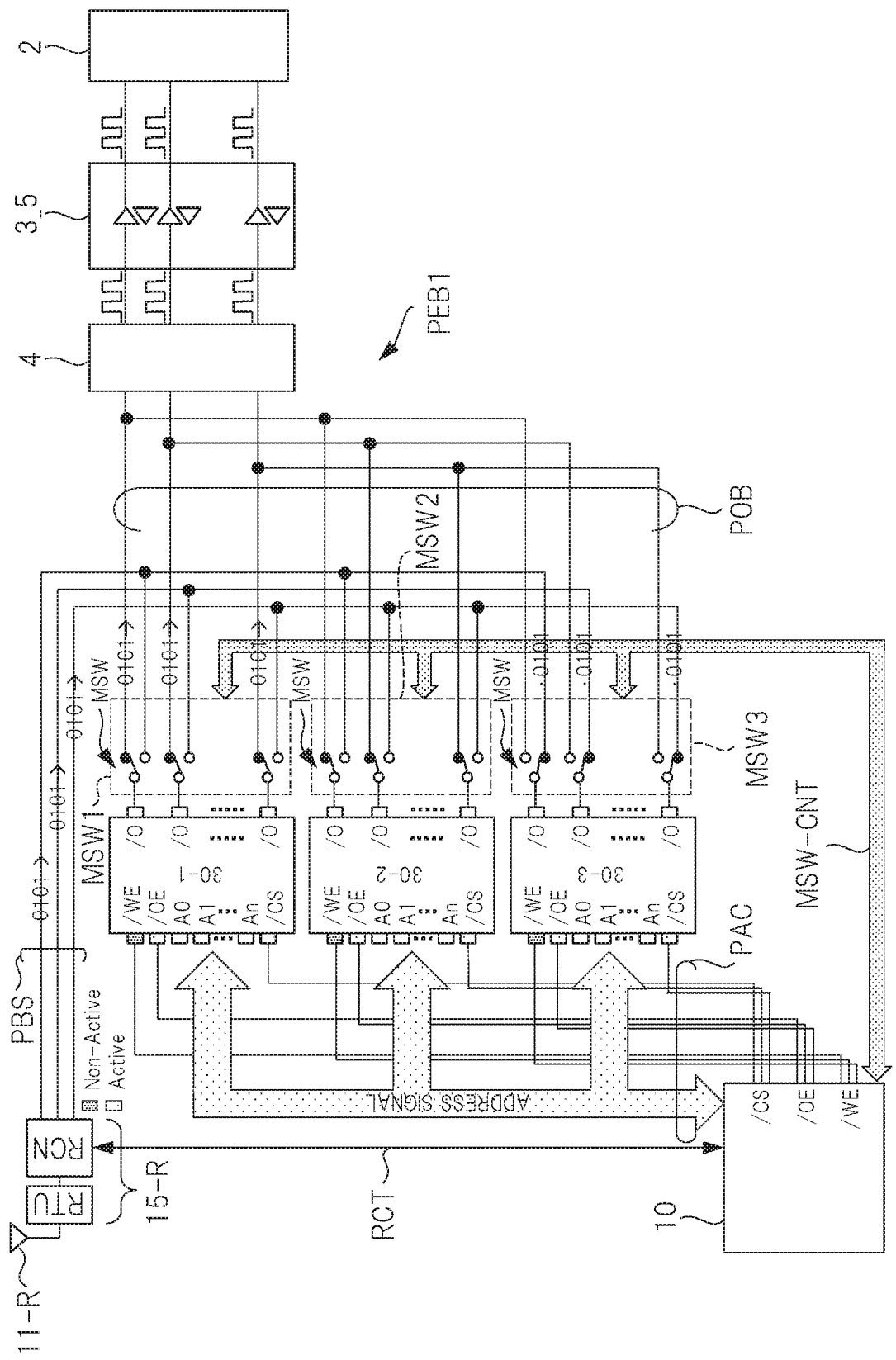
FIG. 6 is a block diagram illustrating a principal part of the testing board according to the first embodiment.

FIG. 6 is a block diagram illustrating a principal part of the testing board according to the first embodiment. This drawing only illustrates portions related to the pattern memory 7_8 in the testing board PEB1. In this drawing, each of the SRAM arrays P-SAY1 to P-SAY3 illustrated in FIG. 5 is constituted of one SRAM 30-1 to 30-3. The SRAMs 30-1 to 30-3 have a configuration equal to each other, and each include a plurality of input-output terminals I/O, a plurality of address terminals A0 to An, a write enable terminal /WE, an output enable terminal /OE, and a chip enable terminal /CS.

In FIG. 6, MSW1 to MSW3 each represent a switch group corresponding to the SRAM 30-1 to 30-3. The switch groups MSW1 to MSW3 are each constituted of the switches MSW described with reference to FIG. 5. In other words, the switch groups MSW1 to MSW3 are each constituted of the plurality of switches MSW connected between the input-output terminals I/O of the corresponding SRAMs 30-1 to 30-3 and each of the test pattern bus PBS and the pattern output bus POB.

The switch groups MSW1 to MSW3 are controlled by a switch selection signal MSW-CNT from the testing processor 10. When described based on the switch group MSW1 as an example, a plurality of switches MSW constituting the switch group MSW1 connect a plurality of input-output terminals I/O of the SRAM 30-1 to the same bus by the switch selection signal MSW-CNT from the testing processor 10. In other words, the plurality of input-output terminals I/O of the SRAM 30-1 are collectively connected to the test pattern bus PBS or the pattern output bus POB. The same applies to the other switch groups MSW2 and MSW3. Note that, although no particular limitation is imposed, the switch selection signal MSW-CNT also serves as an input of the testing processor 10 such that the testing processor 10 can check the state of each of the switch groups MSW1 to MSW3.

The pattern-memory selection signal PAC outputted by the testing processor 10 contains an address signal that is supplied commonly to address terminals A0 to An of the SRAMs 30-1 to 30-3 and chip selection signals each corresponding to the SRAMs 30-1 to 30-3, and also contains a write enable signal and an output enable signal. The testing processor 10 outputs the write enable signal and the output enable signal corresponding to each of the SRAMs 30-1 to 30-3. In the following description, the chip selection signal, the write enable signal, and the output enable signal are denoted by the same reference characters as the corresponding terminals.

As illustrated in FIG. 6, the interface unit RCN in the external interface unit 15-R outputs parallel test pattern portions to the test pattern bus PBS.

The testing processor 10 causes the SRAMs 30-1 to 30-3 to be in any of the ready state, the active state, and the idle state by the switch selection signal MSW-CNT and the pattern-memory selection signal PAC.

Namely, the testing processor 10 causes the SRAM to be in the active state by: causing the input-output terminal I/O of the SRAM to be connected to the pattern output bus POB by the switch selection signal MSW-CNT; causing the SRAM to be in the action state by the chip selection signal /CS; causing the output to be enabled by the output enable signal /OE; and designating readout by the write enable signal /WE. In addition, the testing processor 10 causes the SRAM to be in the idle state by: causing the input-output terminal I/O of the SRAM to be connected to the test pattern bus PBS by the switch selection signal MSW-CNT; causing the SRAM to be in the action state by the chip selection signal /CS; causing the output to be disabled by the output enable signal /OE; and designating writing by the write enable signal /WE. Moreover, the testing processor 10 causes the SRAM to be in the ready state by: causing the input-output terminal I/O of the SRAM to be connected to the pattern output bus POB by the switch selection signal MSW-CNT; causing the SRAM to be in the inaction state by the chip selection signal /CS; and causing the output to be disabled by the output enable signal /OE.

Each of address regions of the SRAM 30-1 to 30-3 is differently allocated from each other in the address region of the pattern memory 7_8. Thus, the address region of the SRAM caused to be in the ready state corresponds to the ready region described above, the address region of the SRAM caused to be in the active state corresponds to the active region described above, and the address region of the SRAM caused to be in the idle state corresponds to the idle region described above.

FIG. 6 illustrates a case where the testing processor 10 causes the SRAM 30-1 to be in the idle state, causes the SRAM 30-2 to be in the ready state, and causes the SRAM 30-3 to be in the active state.

The SRAM 30-1 is in the action state and designation for writing is made thereto. Thus, a test pattern portion in the test pattern bus PBS is supplied through the switch group MSW1 to the plurality of SRAM cells selected by the address signal supplied from the testing processor 10, and the test pattern portion is stored in the selected SRAM cells. At this time, since the SRAM 30-3 is in the action state and designation for readout is made thereto, the stored test pattern portion is read out as a pattern data portion and an expected pattern data portion through the switch group MSW3 to the pattern output bus POB from the plurality of SRAM cells selected by the address signal supplied from the testing processor. The pattern data portion and the expected pattern data portion that have been read out are supplied to the waveform shaping unit 4.

During the time when the pattern data portion is written in the SRAM 30-1 and the pattern data portion and the expected pattern data portion are read out from the SRAM 30-3, the SRAM 30-2 is in the inaction state, and hence, writing operation or readout operation is not performed thereto.

With this configuration, the test pattern portion can be stored in the idle region during the period of time when the test pattern portion (the pattern data portion and the expected pattern data portion) is read out from the active region, as described with reference to FIG. 3. In other words, the pattern memory 7_8 can be rewritten with the test pattern portion during the period of time when the pattern data portion is read out from the pattern memory 7_8.

When reading out of the test pattern portion stored in the SRAM 30-1 and writing of the test pattern portion into the SRAM 30-3 have finished, the testing processor 10 causes the SRAM 30-1 to be in the idle state, causes the SRAM 30-2 to be in the active state, and causes the SRAM 30-3 to be in the ready state. In this manner, the test pattern portion stored in the SRAM 30-2 is read out as the pattern data portion and the expected pattern data portion, and during the period of time when this readout is performed, new test pattern portion is written in the SRAM 30-1. Until the pattern data portion and the expected pattern data portion which correspond to the last test pattern portion of the test pattern in terms of time are supplied to the waveform shaping unit 4, the testing processor 10 repeats while changing the states of the SRAMs 30-1 to 30-3. In this manner, the plurality of divided test pattern portions are sequentially supplied to the waveform shaping unit 4 to test the semiconductor product 2.

FIG. 7 is a diagram illustrating a state transition of the pattern memory according to the first embodiment. In the case where the data transfer rate between the testing memory server 22 and the testing board PEB1 (hereinafter, also referred to as a "transfer rate between a server and a testing board") and the data transfer rate between the testing board PEB1 and the semiconductor product 2 (hereinafter, also referred to as "transfer rate between a testing board and a product") are equal to each other, the testing processor 10 transits the states of the SRAMs 30-1 to 30-3 as illustrated in FIG. 7. In FIG. 7, the reference character R surrounded by a square represents causing the SRAM to be in the ready state; the reference character A surrounded by a square represents causing the SRAM to be in the active state; and the reference character I surrounded by a square represents causing the SRAM to be in the idle state.

The test pattern is divided into a plurality of test pattern portions in the testing memory server 22, and the plurality of test pattern portions obtained through this division are wirelessly transmitted sequentially to the testing board PEB1. The test for the semiconductor product 2 is started at the TEST START illustrated in FIG. 7 and ends at the TEST FINISH. In addition, a test pattern portion is stored in each of the SRAMs 30-1 to 30-3 prior to the TEST START. Although no particular limitation is imposed, one test pattern portion is composed of parallel bit with 128 bits.

With the TEST START, the testing processor 10 causes the SRAM 30-1 to be in the active state, and causes the SRAM 30-2 to be in the ready state. Accordingly, the pattern data portion of the test pattern portion stored in the SRAM 30-1 is outputted to the semiconductor product 2 to test the semiconductor product 2. When the output of the test pattern portion stored in the SRAM 30-1 has finished, the testing processor 10 causes the SRAM 30-1 to be in the idle state, causes the SRAM 30-2 to be in the active state, and causes the SRAM 30-3 to be in the ready state. In this manner, the pattern data portion of the test pattern portion stored in the SRAM 30-2 is outputted to the semiconductor product 2 to test the semiconductor product 2. At this time, since the SRAM 30-1 is in the idle state, the test pattern portion from the testing memory server 22 is written in the SRAM 30-1.

Next, the testing processor 10 causes the SRAM 30-1 to be in the ready state, causes the SRAM 30-2 to be in the idle state, and causes the SRAM 30-3 to be in the active state. Accordingly, the pattern data portion is outputted from the SRAM 30-3, and the test pattern portion from the testing memory server 22 is written in the SRAM 30-2.

Furthermore, the testing processor 10 then causes the SRAM 30-1 to be in the active state, causes the SRAM 30-2 to be in the ready state, and causes the SRAM 30-3 to be in the idle state. The state at this time is illustrated in FIG. 6. At this time, the pattern data portion is outputted from the SRAM 30-1, and the test pattern portion from the testing memory server 22 is written in the SRAM 30-3.

The testing processor 10 changes the states of the SRAMs 30-1 to 30-3 as described above, and this enables the pattern memory 7_8 to be rewritten with a new test pattern portion during the period of time when the pattern data portion and the expected pattern data portion based on the test pattern portion stored in the pattern memory are being outputted from the pattern memory.

The testing processor 10 determines that the test has finished when the test based on the test pattern portion received last in terms of time from the testing memory server 22 is finished.

FIG. 8 is a diagram illustrating a state transition of the pattern memory according to the first embodiment. FIG. 8 illustrates a case where the transfer rate between a testing board and a product is faster than the transfer rate between a server and the testing board. In addition, in FIG. 8, an SRAM 30-4 is added in the pattern memory 7_8. The reference characters A, R, and I each surrounded by a square illustrated in FIG. 8 are the same as those in FIG. 7, and the reference character S in the square illustrated in FIG. 8 represents a stop state in which the SRAM is not used.

Since the transfer rate between a testing board and a product is fast, the testing processor 10 can cause the SRAM 30-4 to be in the active state after causing the SRAM 30-1 to be active. However, the testing processor 10 according to the first embodiment causes the SRAM 30-1 to be in the active state instead of the SRAM 30-4. This makes it possible to make the process of the testing processor 10 remain unchanged even in the case where the transfer rate between a testing board and a product is fast. From another viewpoint, an SRAM that does not store any test pattern portion may be provided in the pattern memory 7_8.

FIG. 9 is a diagram illustrating a state transition of the pattern memory according to the first embodiment. FIG. 9 illustrates a case where the transfer rate between a testing board and a product is slower than the transfer rate between a server and the testing board. In this case, the testing processor 10 changes the states of two SRAMs 30-1 and 30-2. Before the test starts, the testing processor 10 stores the test pattern portion in each of the SRAMs, and causes the SRAM 30-1 to be in the ready state. With the test starting, the testing processor 10 causes the SRAM 30-1 to be in the active state, and causes the SRAM 30-2 to be in the ready state. Accordingly, the semiconductor product 2 is tested on the basis of the test pattern portion stored in the SRAM 30-1. Then, the testing processor 10 causes the SRAM 30-2 to be in the active state, and causes the SRAM 30-1 to be in the idle state. Thereafter, the testing processor 10 causes the SRAM 30-1 and the 30-2 to be in the active state and in the idle state in an alternate manner. In this manner, the pattern memory can be rewritten during the period of time when the pattern data portion and the expected pattern data portion are outputted from the SRAM 30-2 or 30-1 in the pattern memory 7_8.

<<<Operation of Fail Memory>>>

As with the pattern memory 7_8, the SRAM arrays F-SAY1 to F-SAY3 constituting the fail memory 9 each include one SRAM (not illustrated but denoted as 31-1 to 31-3 for the purpose of convenience). The fail-memory selection signal FAC contains an address signal, a chip enable signal, an output enable signal, and a write enable signal as with the pattern-memory selection signal PAC. In addition, the testing processor 10 outputs a switch selection signal for controlling a switch group corresponding to the SRAMs 31-1 to 31-3.

The testing processor 10 causes the SRAMs 31-1 to 31-3 to be in any of the active state, the ready state, and the idle state by the switch selection signal and the fail-memory selection signal FAC. In other words, the testing processor causes the SRAM to be in the active state by: causing the input-output node of the SRAM cell to be connected to the fail input bus FIB by the switch selection signal; causing the SRAM cell to be in the action state by the chip selection signal; causing output to be disabled by the output enable signal; and designating writing by the write enable signal. In addition, the testing processor causes the SRAM to be in the idle state by: causing the input-output node of the SRAM cell to be connected to the fail memory bus FBS by the switch selection signal; causing the SRAM cell to be in the action state by the chip selection signal; causing output to be enabled by the output enable signal; and designating readout by the write enable signal. Moreover, the testing processor 10 causes the SRAM to be in the ready state by: causing the SRAM cell to be in the inaction state by the chip selection signal; and causing output to be disabled by the output enable signal.

Consequently, in the SRAM (for example, 31-2: active region) that is in the active state, the pattern comparison data portion is stored in the plurality of SRAM cells selected by the address signal from the testing processor 10. During this storage being performed, the stored pattern comparison data portion is read out to the fail memory bus FBS from the SRAM (for example, 31-1: idle region) that is in the idle state. The read out pattern comparison data portion is wirelessly transmitted. When storing of the pattern comparison data in the SRAM 31-2 that is in the active state and reading out of the pattern comparison data from the SRAM 31-1 that is in the idle state have finished, the testing processor 10 causes the SRAM 31-2 to be in the idle state, causes the SRAM 31-1 to be in the ready state, and causes the SRAM 31-3 to be in the active state. Until the test based on one test pattern finishes, the testing processor 10 repeats while changing the states of the SRAMs 31-1 to 31-3.

In the operations described above, in the fail memory 9, a new pattern comparison data portion is written in the active region (SRAM in the active state) during the period of time when the pattern comparison data stored in the idle region (SRAM in the idle state) is being outputted. In other words, it is possible to rewrite the fail memory 9 with a new pattern comparison data portion during the period of time when the pattern comparison data portion is being outputted from the fail memory 9.

<Testing Method>

Next, a specific testing method will be described. In FIGS. 5 and 6, description has been made of an example in which each of the pattern memory 7_8 and the fail memory 9 in the testing board PEB1 includes three SRAM arrays, for the easiness of description. As described above, the pattern memory 7_8 stores both of the pattern data portion and the expected pattern data portion. Thus, the pattern memory 7_8 typically has a data capacity larger than that of the fail memory 9.

For this reason, the testing method will be specifically described on the assumption that the fail memory 9 includes three SRAM arrays as illustrated in FIG. 5 and the pattern memory 7_8 includes six SRAM arrays P-SAY1 to P-SAY6. If description is made with reference to FIG. 6, the pattern memory 7_8 includes SRAMs 30-1 to 30-6. In the following description, the six SRAM arrays P-SAY1 to P-SAY6 are also simply referred to as memory arrays <1> to <6>. Similarly, the SRAM arrays F-SAY1 to F-SAY3 constituting the fail memory 9 are also simply referred to as fail arrays [1] to [3] or fail arrays.

The testing method is broadly carried out through four sequences. Namely, a test to a semiconductor product is performed by executing a pre-test sequence before start of a test, a test execution sequence, a pattern-data rewriting sequence, and a test ending sequence. These four sequences will be described with reference to FIG. 10 to FIG. 12.

FIG. 10 is a flowchart diagram illustrating a pre-test sequence according to the first embodiment. When a test for the semiconductor product 2 starts in step SP0, a pre-test step SP starts. In step SP1, the testing processor 10 reads a test program from the testing device controller 23 through the bus 14. The testing processor 10 executes the four sequences on the basis of the read test program.

Here, description will be made of a case where there are many test patterns for testing the semiconductor product 2, the testing memory server 22 divides a test pattern into seven test pattern portions (1) to (7), and the test pattern portions (1) to (7) are wirelessly transmitted to the testing board PEB1 in this order. Note that the testing memory server 22 also wirelessly transmits "7" serving as the division-number information to the testing board PEB1. Here, for the easiness of description, the data capacities of the divided test pattern portions (1) to (7) are equal to each other, and the data capacities of six SRAM arrays are equal to the data capacity of one test pattern portion. Thus, in the pre-test step SP, the six test pattern portions (1) to (6) are stored in the pattern memory 7_8, and then, the step proceeds to the test execution sequence. The pre-test step SP will be specifically described below.

In step SP2, the testing processor 10 controls the external interface unit 15-R by the control signal RCT to receive the test pattern portion (1) transmitted first from the testing memory server 22 and output it to the test pattern bus PBS. Next, in step SP3, the testing processor 10 selects a memory array <1> by the pattern-memory selection signal PAC, and causes an SRAM cell in the memory array <1> to be connected to the test pattern bus PBS with the switch group MSW1 corresponding to the memory array <1> by the switch selection signal MSW-CNT. At this time, the testing processor 10 designates writing in the memory array <1> by the write enable signal /WE of the pattern-memory selection signal PAC. In this manner, the test pattern portion (1) is written in the memory array <1> in step SP3.

Next, in step SP4, the testing processor 10 receives the test pattern portion (2) transmitted next from the testing memory server 22, and controls the external interface unit 15-R so as to output it to the test pattern bus PBS. In addition, in step SP5, the testing processor 10 selects a memory array <2> by the pattern-memory selection signal PAC, and controls such that the switch group MSW2 corresponding to the memory array <2> connects the memory array <2> to the test pattern bus PBS by the switch selection signal MSW-CNT. In this manner, the test pattern portion (2) is written in the memory array <2> as with the case of step SP3 described above. Thereafter, steps SP6 to SP13, which are similar to steps SP2 and SP3, are repeated alternately. Thus, when step SP13 finishes, the test pattern portions (1) to (6) are stored in the memory arrays <1> to <6> constituting the pattern memory 7_8.

When the six memory arrays constituting the pattern memory 7_8 are filled with the test pattern portions (1) to (6), the testing processor 10 determines that the pattern memory 7_8 does not have any memory array that can store an additional test pattern portion. In addition, since the division-number information notified from the testing memory server 22 is "7", the testing processor 10 determines that the pattern-data rewriting sequence needs to be executed once, and then starts the test execution step SE for the test execution sequence.

Figure 11:
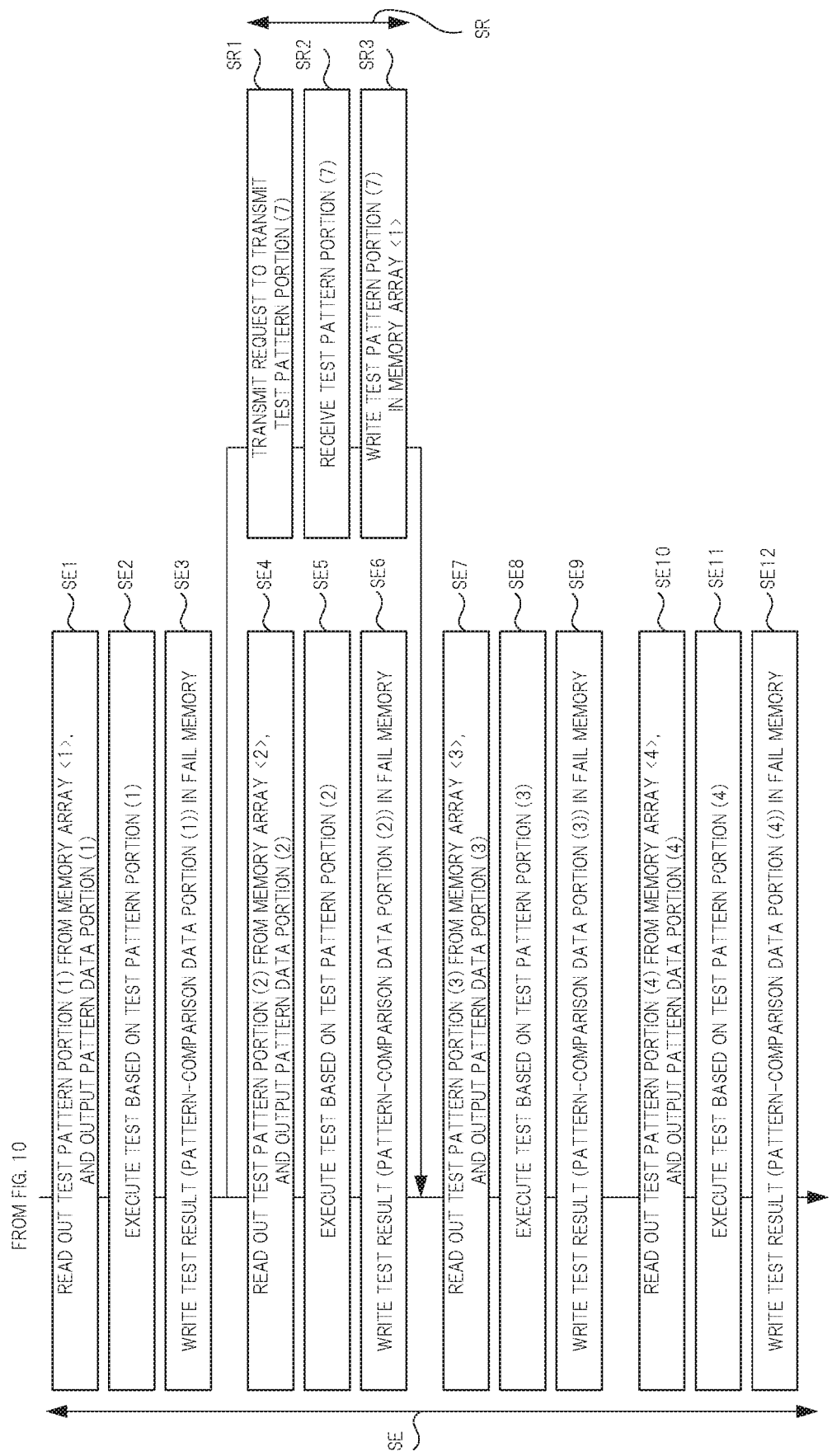
FIG. 11 is a flowchart diagram illustrating a test execution sequence and a pattern-data rewriting sequence according to the first embodiment.
Figure 12:
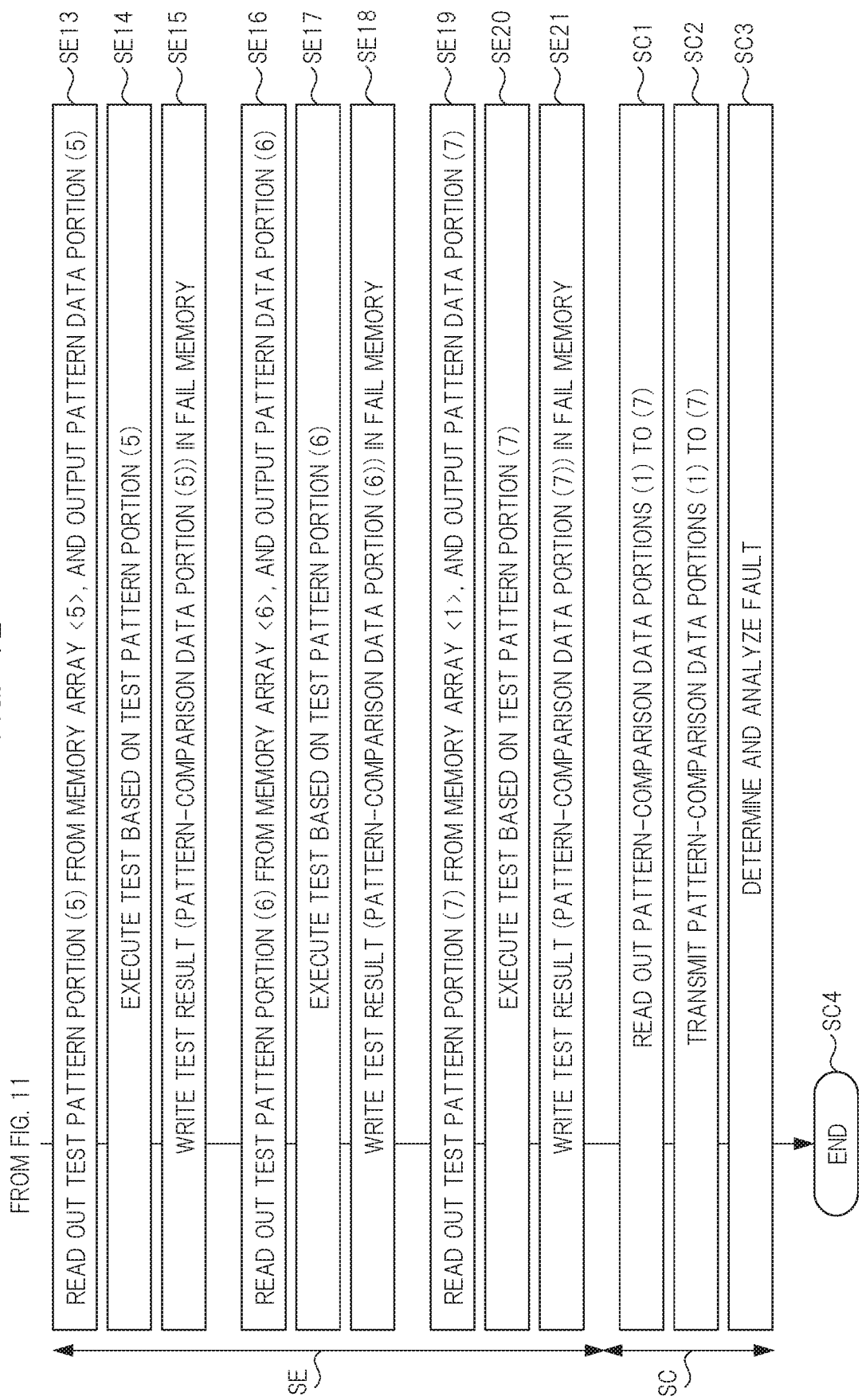
FIG. 12 is a flowchart diagram illustrating a test execution sequence and a test ending sequence according to the first embodiment.

FIG. 11 is a flowchart diagram illustrating the test execution sequence and the pattern-data rewriting sequence according to the first embodiment. In addition, FIG. 12 is a flowchart diagram illustrating the test execution sequence and the test ending sequence according to the first embodiment. The testing processor 10 executes the test execution step SE for the test execution sequence that extends across FIG. 11 and FIG. 12. In addition, the testing processor 10 executes the step SR for the pattern-data rewriting sequence in FIG. 11.

In the test execution step SE, the testing processor 10 first selects the memory array <1> by the pattern-memory selection signal PAC, and controls the corresponding switch group MSW1 by the switch selection signal MSW-CNT such that the SRAM cell in the memory array <1> is connected to the pattern output bus POB. At this time, the testing processor 10 designates reading to the memory array <1> by the write enable signal /WE. With this operation, the test pattern portion (1) stored in the memory array <1> is outputted to the pattern output bus POB, and is supplied to the waveform shaping unit 4. Since the test pattern portion (1) supplied to the waveform shaping unit 4 includes the pattern data portion (1) and the expected pattern data portion (1), the waveform shaping unit 4 cuts out the pattern data portion (1) from the test pattern portion (1) on the basis of the selection signal SEL from the testing processor 10, and outputs it through the logic comparing unit 3_5 to the semiconductor product 2.

In step SE2, the semiconductor product 2 executes operations in accordance with the pattern data portion (1) supplied in step SE1. With this execution, the semiconductor product 2 outputs the output data corresponding to the pattern data portion (1) to the logic comparing unit 3_5. In addition, the waveform shaping unit 4 supplies the expected pattern data portion (1) cut out from the test pattern portion (1) to the logic comparing unit 3_5. In the logic comparing unit 3_5, logical comparison is performed between the output data outputted from the semiconductor product 2 and the expected pattern data portion (1). The logic comparing unit 3_5 outputs the result of comparison to the fail input bus FIB as the pattern comparison data portion (1). In other words, in step SE2, a test based on the test pattern portion (1) is executed.

In step SE3, the testing processor 10 selects a fail array from the fail memory 9 by the fail-memory selection signal FAC, and controls the switch group corresponding to the selected fail array by the switch selection signal such that an SRAM cell in the selected fail array is connected to the fail input bus FIB. In this manner, the pattern comparison data portion (1) is written in the fail memory 9.

The testing processor 10 determines that the memory array <1> can be used as the idle region on the basis of the fact that readout of the test pattern portion (1) stored in the memory array <1> has finished, and executes the pattern-data rewriting sequence. In this case, the testing processor 10 executes the test execution sequence and the pattern-data rewriting sequence in a temporally parallel manner. In other words, execution of a test based on the test pattern portion (2) stored in the memory array <2> and writing of the test pattern portion (7) to the memory array <1> are executed substantially at the same time. In this case, writing of the test pattern portion (7) to the memory array <1> serves as rewriting to the pattern memory 7_8.

More specifically, in step SE4, the testing processor 10 selects the memory array <2> by the pattern-memory selection signal PAC. In addition, the testing processor 10 controls the switch group MSW2 corresponding to the memory array <2> by the switch selection signal MSW-CNT such that an SRAM cell in the memory array <2> is connected to the pattern output bus POB. At this time, the testing processor 10 designates reading by the write enable signal /WE to the memory array <2>. In this manner, the pattern data portion (2) is outputted from the memory array <2> to the pattern output bus POB.

Next, in step SE5, as with the case of step SE2 described above, the waveform shaping unit 4 cuts out the pattern data portion (2) from the test pattern portion (2), and supplies it to the semiconductor product 2 through the logic comparing unit 3_5. The semiconductor product 2 outputs output data corresponding to the pattern data portion (2) to the logic comparing unit 3_5. Since the expected pattern data portion (2) is supplied to the logic comparing unit 3_5 from the waveform shaping unit 4, the logic comparing unit 3_5 performs logical comparison between the expected pattern data portion (2) and the output data from the semiconductor product 2, and outputs the pattern comparison data portion (2) as the result of comparison to the fail input bus FIB.

In step SE6, as with the case of step SE3, the testing processor 10 outputs the fail-memory selection signal FAC for selecting a fail array from the fail memory 9. In addition, the testing processor 10 outputs a switch selection signal for causing an SRAM cell in the selected fail array to be connected to the fail input bus FIB, to a switch group corresponding to the fail array selected from the fail memory 9. With this operation, the pattern comparison data portion (2) is written in the fail memory 9.

During the period of time when steps SE4 to SE6 described above are executed, the testing processor 10 executes the step SR for the pattern rewriting sequence. Namely, in step SR1, the testing processor 10 issues a request to the testing memory server 22 by the control signal SCT. This request is to request the testing memory server 22 to transmit the remaining one test pattern portion (7). This request is converted into a wireless signal by the external interface unit 15-S before being transmitted.

When the testing memory server 22 receives this request, the testing memory server 22 transmits the test pattern portion (7) in step SR2. The test pattern portion (7) is received by the wireless antenna 11-R, is converted by the external interface unit 15-R, and is outputted to the test pattern bus PBS.

In step SR3, the testing processor 10 selects the memory array <1> by the pattern-memory selection signal PAC. In addition, the testing processor 10 controls the switch group MSW1 corresponding to the memory array <1> by the switch selection signal MSW-CNT such that an SRAM cell in the memory array <1> is connected to the test pattern bus PBS. In this manner, a new test pattern portion (7) is stored in the memory array <1>.

After step SE6 is executed, steps SE7 to SE9 which are similar to steps SE1 to SE3 described above are executed for the memory array <3>. Accordingly, a test based on the test pattern portion (3) is executed to the semiconductor product 2, and the result of the execution is written in the fail memory 9 as the pattern comparison data portion (3).

Furthermore, after step SE9 is executed, steps SE10 to SE12 which are similar to steps SE1 to SE3 described above are executed for the memory array <4>. Accordingly, a test based on the test pattern portion (4) is executed to the semiconductor product 2, and the result of the execution is written in the fail memory 9 as the pattern comparison data portion (4).

As illustrated in FIG. 12, steps SE13 to SE15 which are similar to steps SE1 to SE3 described above are executed for the memory array <5>. Accordingly, a test based on the test pattern portion (5) is executed to the semiconductor product 2, and the result of the execution is written in the fail memory 9 as the pattern comparison data portion (5). In addition, steps SE16 to SE18 which are similar to steps SE1 to SE3 described above are executed for the memory array <6>. Accordingly, a test based on the test pattern portion (6) is executed to the semiconductor product 2, and the result of the execution is written in the fail memory 9 as the pattern comparison data portion (6).

Through these processes described above, tests related to the test pattern portions (1) to (6) stored in the memory arrays <1> to <6> in the pre-test sequence finish. However, since the testing processor 10 executes the pattern-data rewriting sequence to identify that the pattern data portion (7) is stored in the memory array <1>, the testing processor 10 executes step SE19 which is similar to step SE1 described above to the memory array <1> again. With this step, the test pattern portion (7) written in the memory array <1> in step SR3 is outputted from the memory array <1> to the pattern output bus POB. Next, step SE20 which is similar to step SE2 described above is executed. Namely, the semiconductor product 2 outputs output data corresponding to the pattern data portion (7) contained in the test pattern portion (7), and the logic comparing unit 3_5 performs logical comparison between the expected pattern data portion (7) contained in the test pattern portion (7) and the output data from the semiconductor product 2 to output the pattern comparison data portion (7). In addition, the testing processor 10 executes step SE21 which is similar to step SE3 described above. In this manner, the pattern comparison data portion (7) corresponding to the test pattern portion (7) is written in the fail memory 9.

Next, the testing processor 10 executes the step SC for the test ending sequence. In step SC1, the testing processor 10 selects a fail array from the fail memory 9 by the fail-memory selection signal FAC. In addition, the testing processor 10 controls such that a switch group corresponding to the selected fail array connects an SRAM cell in the selected fail array to the fail memory bus FBS. At this time, although no particular limitation is imposed, the testing processor 10 selects the fail array and the SRAM cell such that the pattern comparison data portions (1) to (7) stored in the fail memory 9 are outputted to the fail memory bus FBS in this order.

In step SC2, the testing processor 10 controls the external interface unit 15-S by the control signal SCT to give an instruction to wirelessly transmit the pattern comparison data portions (1) to (7) that have been outputted to the fail memory bus FBS. With this operation, the external interface unit 15-S transmits the pattern comparison data portions (1) to (7) to the testing memory server 22 by the wireless antenna 11-S.

Step SC3 is an operation made by an operator using the testing memory server 22. The operator operates the input-output device IOS (FIG. 4) to perform determination and analysis as to fault by referencing the pattern comparison data portions (1) to (7) stored in the testing memory server 22. Then, in step SC4, the test for the semiconductor product 2 finishes. Note that the pattern comparison data portions (1) to (7) are also collectively referred to as fail data.

<Data Capacity of Pattern Memory>

Figure 13:
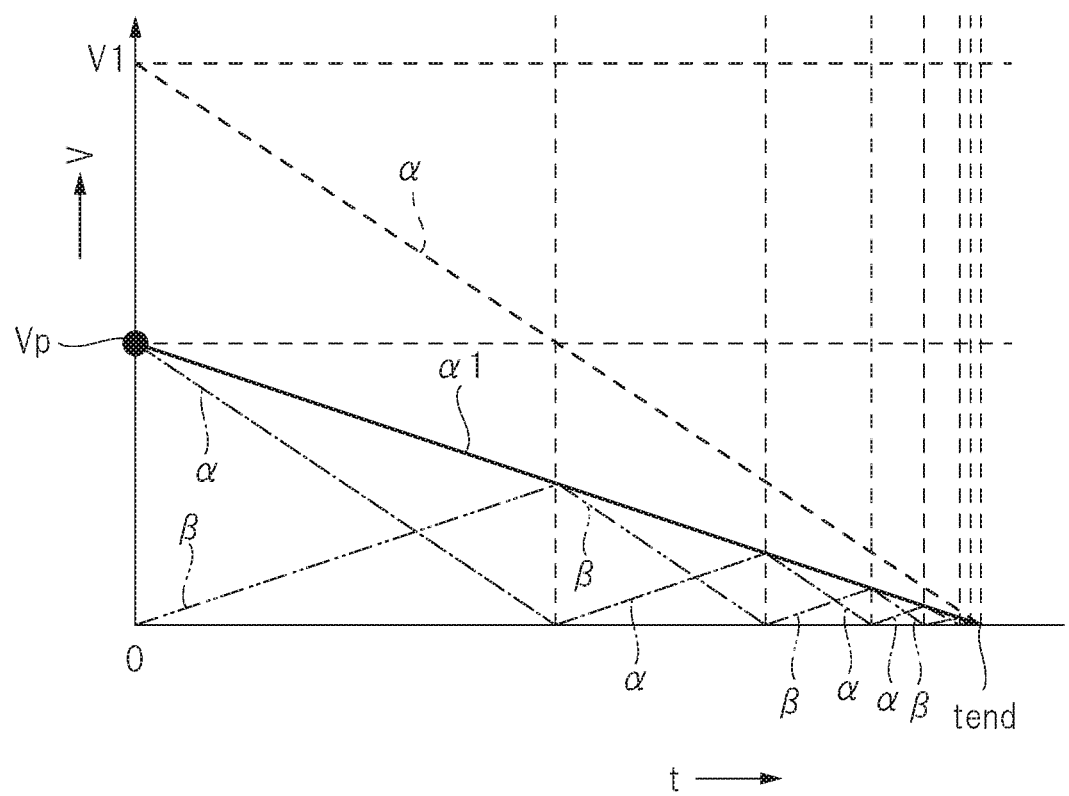
FIG. 13 is a diagram for describing an effect obtained by the testing device according to the first embodiment.

FIG. 13 is a diagram for describing effects of the testing device according to the first embodiment. In this drawing, the horizontal axis represents time required for test, and the vertical axis represents data amount of test patterns (pattern data and expected pattern data) required for test.

It is assumed that the data amount of test pattern required for testing the semiconductor product 2 is V1. Thus, at the time t=0 when a test starts, the data amount of test pattern is V1 as illustrated in this drawing. As the test proceeds, the data amount decreases in a manner described by the dashed line with the gradient α, and reaches zero at the time t=tend when the test finishes. In this case, the pattern memory needs to have the data capacity that can store the data amount V1 at the time t=0. Thus, the pattern memory with a large volume is necessary.

On the other hand, in the case of the first embodiment, rewriting for the pattern memory is performed during the period of time when the test pattern is being outputted to the semiconductor product 2 as described with reference to, for example, FIG. 7. Thus, at the time t=0 when the test starts, the data amount stored in the pattern memory may be smaller than the data amount V1. In FIG. 13, the data amount stored in the pattern memory at the time of starting the test is indicated as Vp, which is smaller than the data amount V1. As the test proceeds, the data amount of test pattern stored in the pattern memory decreases from the data amount Vp in a manner described by the dash-dotted line with the gradient α. On the other hand, the data amount of a new test pattern portion increases due to rewriting. In the same drawing, the data amount increasing due to rewriting is indicated by the two-dot chain line with the gradient β. The data capacity required for the pattern memory is equal to the sum of the data amount indicated by the dash-dotted line and the data amount indicated by the two-dot chain line. In FIG. 13, the sum of the data amount indicated by the dash-dotted line and the data amount indicated the two-dot chain line is indicated by the solid line. As illustrated in FIG. 13, in the case of the testing device according to the first embodiment, the data amount α1 (solid line) per unit time which decreases as the test proceeds is smaller than that in the case of the dashed line, but it is possible to reduce the data amount required for the pattern memory while preventing the testing time required for the test from increasing.

Second Embodiment

Figure 14:
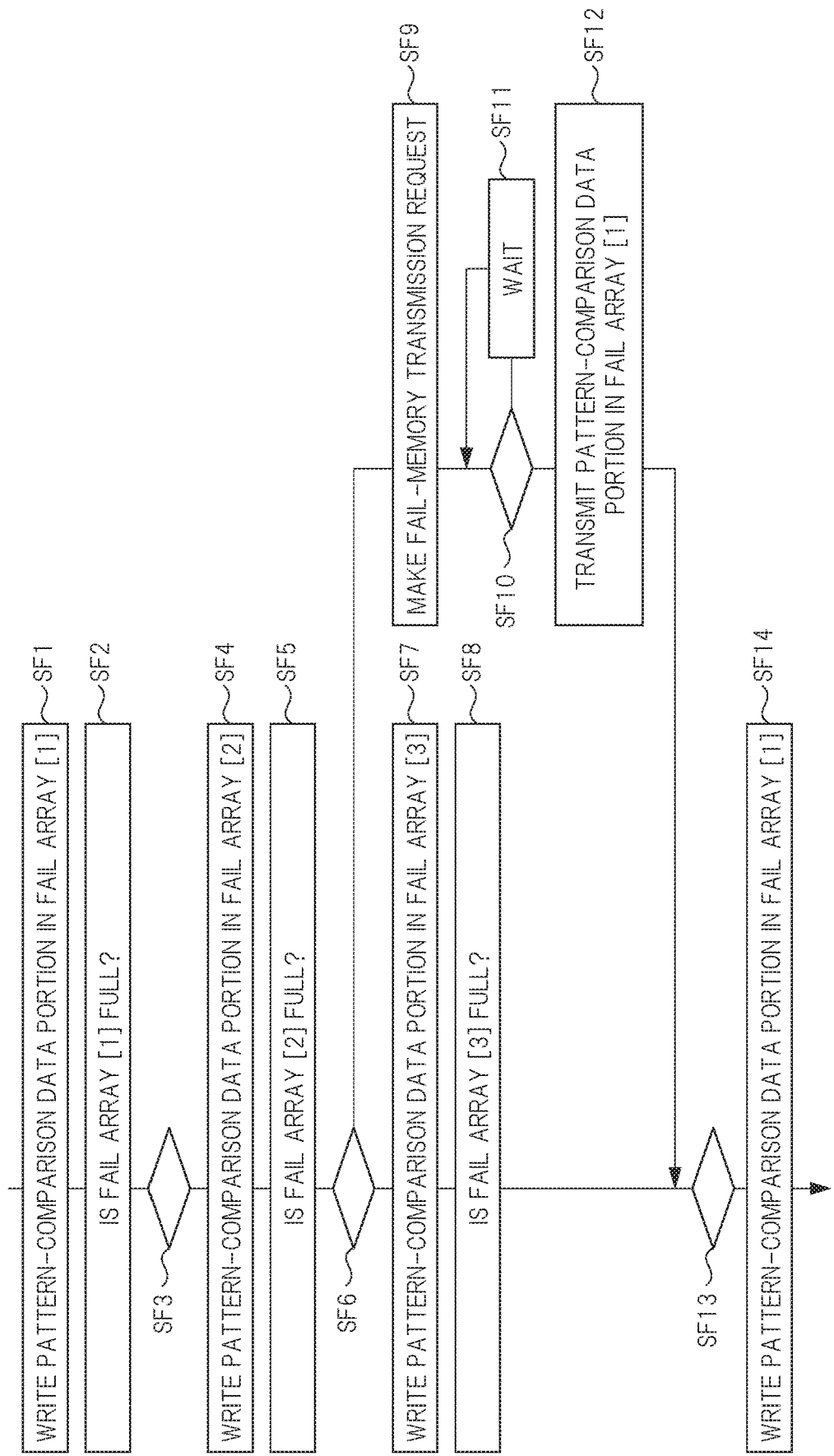
FIG. 14 is a flowchart diagram illustrating operation of a testing device according to a second embodiment.

A second embodiment provides a technique for reducing the data amount required for the fail memory 9. FIG. 14 is a flowchart diagram illustrating operation of a testing device according to the second embodiment. The configuration of the testing device 1 according to the second embodiment is the same as that of the testing device described in the first embodiment, and hence, description thereof will not be repeated. In the second embodiment, as with the first embodiment, the testing processor 10 rewrites a pattern memory during the period of time when test pattern portions are being outputted from the pattern memory.

In the case of the second embodiment, the fail memory 9 includes the three fail arrays F-SAY1 to F-SAY3 as illustrated in FIG. 5. In addition, it is assumed that pattern comparison data portions are written in the order from the fail arrays F-SAY1 to F-SAY3. In other words, pattern comparison data portions are first written in the fail array F-SAY1, and at the time when the fail array F-SAY1 becomes full of pattern comparison data portions, the pattern comparison data portions are written in the next fail array F-SAY2.

In the second embodiment, when two fail arrays become full of pattern comparison data portions, the testing processor 10 controls to transmit the pattern comparison data portions stored in the full fail arrays to the testing memory server 22. At this time, the testing processor 10 controls to write a new pattern comparison data portion in another fail array. Namely, during the period of time when pattern comparison data portions stored in the fail memory 9 are outputted, the testing processor 10 operates such that the fail memory 9 is rewritten with a new pattern comparison data portion.

This will be described below in detail. In step SF1, the testing processor 10 selects a fail array [1] by the fail-memory selection signal FAC such that pattern comparison data portion is written in the fail array F-SAY1 (fail array [1]). In addition, the testing processor 10 controls a switch group by the switch selection signal such that the switch group corresponding to the fail array [1] connects an SRAM cell in the fail array [1] to the fail input bus FIB. With this operation, pattern comparison data portion is written in the fail array [1].

Next, in step SF2, the testing processor 10 detects whether the fail array [1] is full of pattern comparison data portions. If the fail array [1] is full, the testing processor 10 updates the number of full memories (adds one).

In step SF3, the testing processor 10 determines whether the updated number of full memories is greater than two. Here, description will be made on the assumption that the fail array [1] is full of pattern comparison data portions and the updated number of full memories is determined to be smaller than two.

In the case where a new pattern comparison data portion is written in the fail memory 9 after step SF3, the testing processor 10 executes step SF4. In step SF4, the testing processor 10 writes a pattern comparison data portion in the fail array F-SAY2 (fail array [2]) in the fail memory 9 as with the case of step SF1. Namely, since the fail array [1] is full, the testing processor 10 outputs the fail-memory selection signal FAC and a switch selection signal for a switch group such that the pattern comparison data portion is written in the fail array [2].

Next, in step SF5, the testing processor 10 detects whether the fail array [2] is full of pattern comparison data portions. If the fail array [2] is full, the number of full memories is updated as with the case of step SF2. In step SF6, the testing processor 10 determines whether the updated number of full memories is greater than two as with the case of step SF3. If the updated number of full memories is smaller than two, the testing processor 10 repeats steps SF4 to SF6 when a new pattern comparison data portion is written in the fail memory 9.

In the case where the fail array [2] becomes full as a result of writing of a new pattern comparison data in the fail array [2] and the updated number of full memories is determined to be greater than two in step SF6, the testing processor 10 writes a pattern comparison data portion in the fail array F-SAY3 (fail array [3]) in step SF7 as with the case of step SF1. In addition, the testing processor 10 determines in step SF8 whether the fail array [3] is full as with the case of step SF2, and if the fail array [3] is full, the number of full memories is updated.

Furthermore, if the updated number of full memories is greater than two in step SF6, the testing processor 10 executes steps SF9 to SF12 in temporally parallel with steps SF7 and SF8. In step SF9, the testing processor 10 controls the external interface unit 15-S by the control signal SCT to transmit, to the testing memory server 22, a fail-memory transmission request for transmitting the pattern comparison data portion. The testing processor 10 detects in step SF10 whether the testing memory server 22 accepts this fail-memory transmission request. The testing processor 10 executes step SF11 until the testing memory server 22 accepts. Since this step SF11 is a waiting process, the testing processor 10 waits for acceptance from the testing memory server 22 in response to the fail-memory transmission request in steps SF10 and SF11.

When acceptance from the testing memory server 22 is detected in step SF10, the testing processor 10 executes step SF12. In step SF12, the testing processor 10 selects the fail array [1] by the fail-memory selection signal FAC. In addition, the testing processor 10 controls the switch group by the switch selection signal such that the switch group corresponding to the fail array [1] connects an SRAM cell in the fail array [1] to the fail memory bus FBS. Moreover, the testing processor 10 controls the external interface unit 15-S by the control signal SCT to wirelessly transmit the pattern comparison data portion outputted from the fail array [1] to the fail memory bus FBS. In this manner, the pattern comparison data portion stored in the fail array [1] is transmitted to the testing memory server 22, and is stored in testing memory server 22.

Furthermore, although no particular limitation is imposed, the testing processor 10 decreases the number of full memories in step SF12 (deducts one).

Through steps SF7 to SF12 described above, the pattern comparison data portion stored in the fail memory 9 is outputted to the testing memory server 22, and the fail memory 9 is rewritten with a new pattern comparison data portion.

Next, the testing processor 10 determines whether the number of full memories is greater than two in step S13. In this case, since the number of full memories is reduced in step SF12, the updated number of full memories is smaller than two. Thus, in step SF14, a new pattern comparison data portion is written in the fail array [1]. After step SF14, step SF2 is executed. Accordingly, from the viewpoint of writing of the pattern comparison data portion, the fail arrays [1] to [3] constituting the fail memory 9 are connected in a ring manner. In other words, in the case where the fail array [3] is full, a new pattern comparison data portion is written in the fail array [1] again.

Here, an example in which the fail array [1] is full and the number of full memories is greater than two has been described as an example. However, even in the case where two fail arrays become full and the number of full memories is greater than two with other combinations, pattern comparison data portions are similarly transmitted from the full fail arrays to the testing memory server 22. Of course, the number of fail arrays constituting the fail memory 9 is not limited to three. In addition, the number of full memories is not limited to two, and any number may be taken to transmit pattern comparison data portions from the fail memory.

As described above, in the case of the second embodiment, when the number of full memories becomes greater than two, a pattern comparison data portion stored in the fail memory 9 is transmitted to the testing memory server 22. During the period of time when the pattern comparison data portion is being transmitted, the fail memory 9 is rewritten with a new pattern comparison data portion. Thus, it is possible to reduce the data capacity of the fail memory 9.

Third Embodiment

Figure 15:
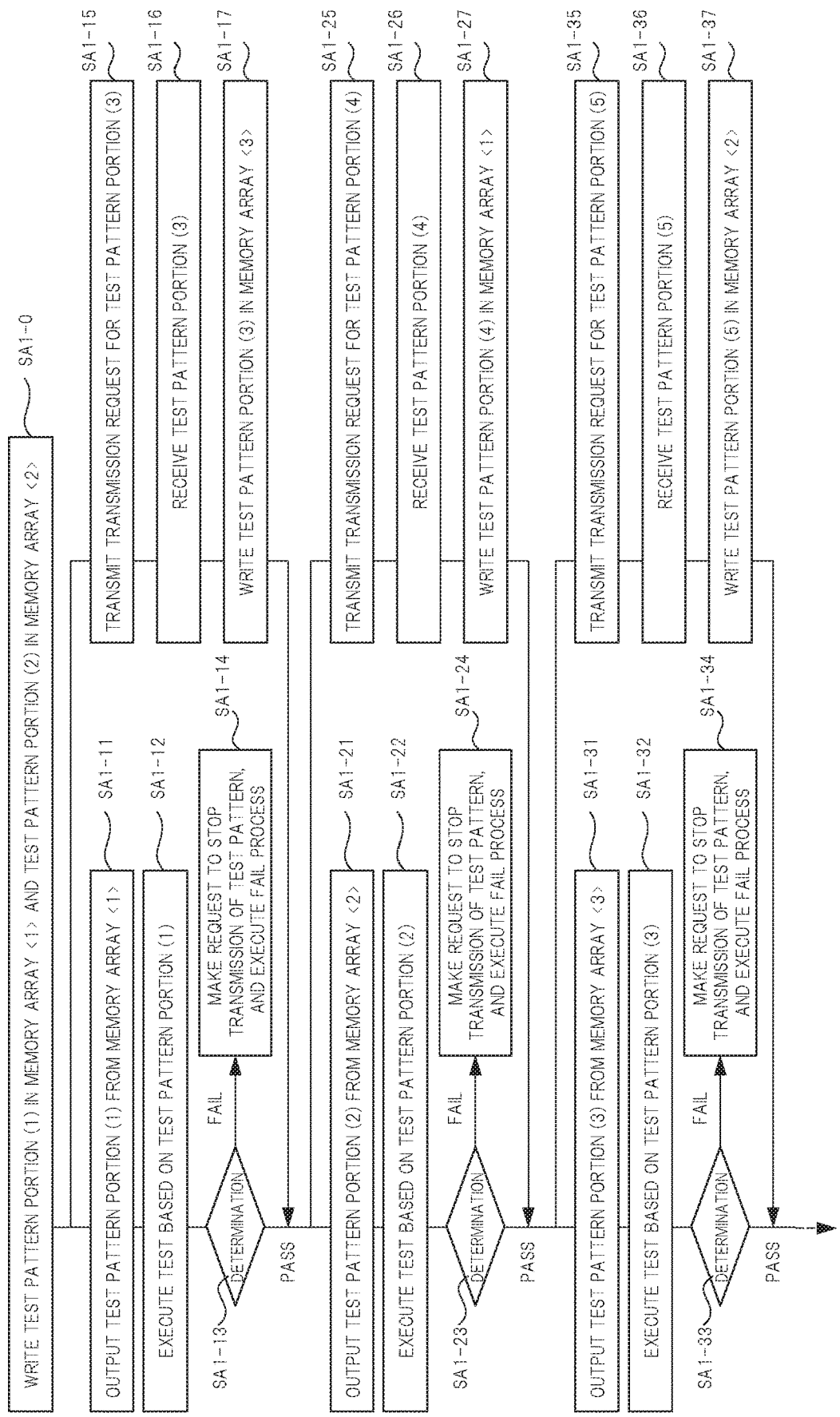
FIG. 15 is a flowchart diagram illustrating operation of a testing device according to a third embodiment.

FIG. 15 is a flowchart diagram illustrating operation of a testing device according to a third embodiment. The third embodiment provides a technique of stopping the transmission of a new test pattern portion from the testing memory server 22 in the case where any failure is found when a semiconductor product is tested on the basis of test pattern portions formed by division. With this technique, in the case where a semiconductor product has any fault, it is possible to reduce unnecessary transmission of a test pattern portion from the testing memory server 22. The configuration of the testing device according to the third embodiment is the same as that described in the first embodiment, and hence, description thereof will not be repeated. Next, a specific example will be described with reference to FIG. 15.

Step SA1-0 corresponds to the pre-test step SP illustrated in FIG. 10. Namely, in step SA1-0, the test pattern portion (1) is stored in the memory array P-SAY1 (memory array <1>) constituting the pattern memory, and the test pattern portion (2) is stored in the memory array P-SAY2 (memory array <2>). After this step SA1-0 finishes, a test for the semiconductor product 2 starts.

In step SA1-11, the testing processor 10 causes the test pattern portion (1) to be outputted from the memory array <1>, and causes the waveform shaping unit 4 to output the pattern data portion (1) and the expected pattern data portion (1) of the test pattern portion (1). In step SA1-12, the semiconductor product 2 outputs output data corresponding to the pattern data portion (1), and the logic comparing unit 3_5 performs logical comparison between the output data from the semiconductor product 2 and the expected pattern data portion (1). The logic comparing unit 3_5 outputs the pattern comparison data portion (1) to the fail memory 9 as the result of comparison, and outputs the fail signal FRT to the testing processor 10. In other words, in step SA1-12, a test based on the test pattern portion (1) is executed. The testing processor 10 determines in step SA1-13 on the basis of the fail signal FRT whether any fault is found. For example, in the case where a logical inconsistency between the output data and the expected pattern data portion (1) is notified by the fail signal FRT, the testing processor 10 determines that a fault is found.

In the case where a fault (fail) is determined, the testing processor 10 executes step SA1-14, whereas, in the case where no fault (pass) is determined, the testing processor 10 executes step SA1-21.

Meanwhile, the testing processor 10 executes steps SA1-15 to SA1-17 in temporally parallel with steps SA1-1 to SA1-13 described above. In step SA1-15, the testing processor 10 transmits, to the testing memory server 22, a test-pattern transmission request (transmission request) to transmit the test pattern portion (3). When the testing memory server 22 receives this transmission request, the testing memory server 22 transmits the test pattern portion (3). In step SA1-16, the testing processor 10 controls the external interface unit 15-R to receive the test pattern portion (3). In addition, in step SA1-17, the testing processor 10 writes the test pattern portion (3) received in step SA1-16, in the memory array <3>.

In the case where it is determined in step SA1-13 that there is no fault, the test pattern portion (3) is stored in the memory array <3>, and step SA1-21 is executed. On the other hand, in the case where it is determined in step SA1-13 that there is a fault, the testing processor 10 controls the external interface unit 15-S in step SA1-14 to transmit a request to stop the transmission of the test pattern, and the testing processor 10 executes a fault handling process (fail process) for handling the fault. When the testing memory server 22 receives the request to stop the transmission of the test pattern, the testing memory server 22 stops the transmission of the test pattern portion.

For example, when the testing memory server 22 receives the request to stop the transmission of the test pattern, the testing memory server 22 does not transmit any new test pattern portion after the test pattern portion (3) unless receiving a new test-pattern transmission request.

In the case where it is determined in step SA1-13 that there is no fault, the testing processor 10 executes steps SA1-21 to SA1-27. Steps SA1-21 to SA1-27 are similar to steps SA1-11 to SA1-17 described above. Namely, the difference therebetween is that steps SA1-11 to SA1-14 described above relate to a test based on the test pattern portion (1) stored in the memory array <1> and steps SA1-21 to SA1-24 relate to a test based on the test pattern portion (2) stored in the memory array <2>. In addition, the difference therebetween is that steps SA1-15 to SA1-17 described above relate to a process for storing the test pattern portion (3) in the memory array <3> and steps SA1-25 to SA1-27 relate to a process for storing the test pattern portion (4) in the memory array <1>.

Thereafter, steps similar to steps SA1-11 to SA1-17, for example, steps SA1-31 to SA1-37 are repeated.

In the third embodiment, whether any fault exists is determined by the tests for each test pattern portion, and in the case where it is determined that there is a fault, the testing device 1 issues, to the testing memory server 22, a request to stop the transmission of a test pattern portion. This makes it possible to reduce unnecessary transmission. In addition, it is possible to stop the test of a semiconductor product that is determined to be a fault.

An example in which a request to stop the transmission of the test pattern is transmitted in step SA1-14 has been described, but the present invention is not limited to this. For example, in the case where the fault is recovered by the execution of the fault handling process in step SA1-14, it may be possible to cause the testing memory server 22 to resume transmission of the pattern data portion. This resumption can be achieved by, for example, configuring the testing processor 10 to transmit a test-pattern transmission request in step SA1-14. Alternatively, the testing processor may be configured to continuously execute steps SA1-21 and SA1-25 in the case where the fault is recovered by the execution of the fault handling process in step SA1-14, as with the case where it is determined that there is no fault.

Fourth Embodiment

Figure 16:
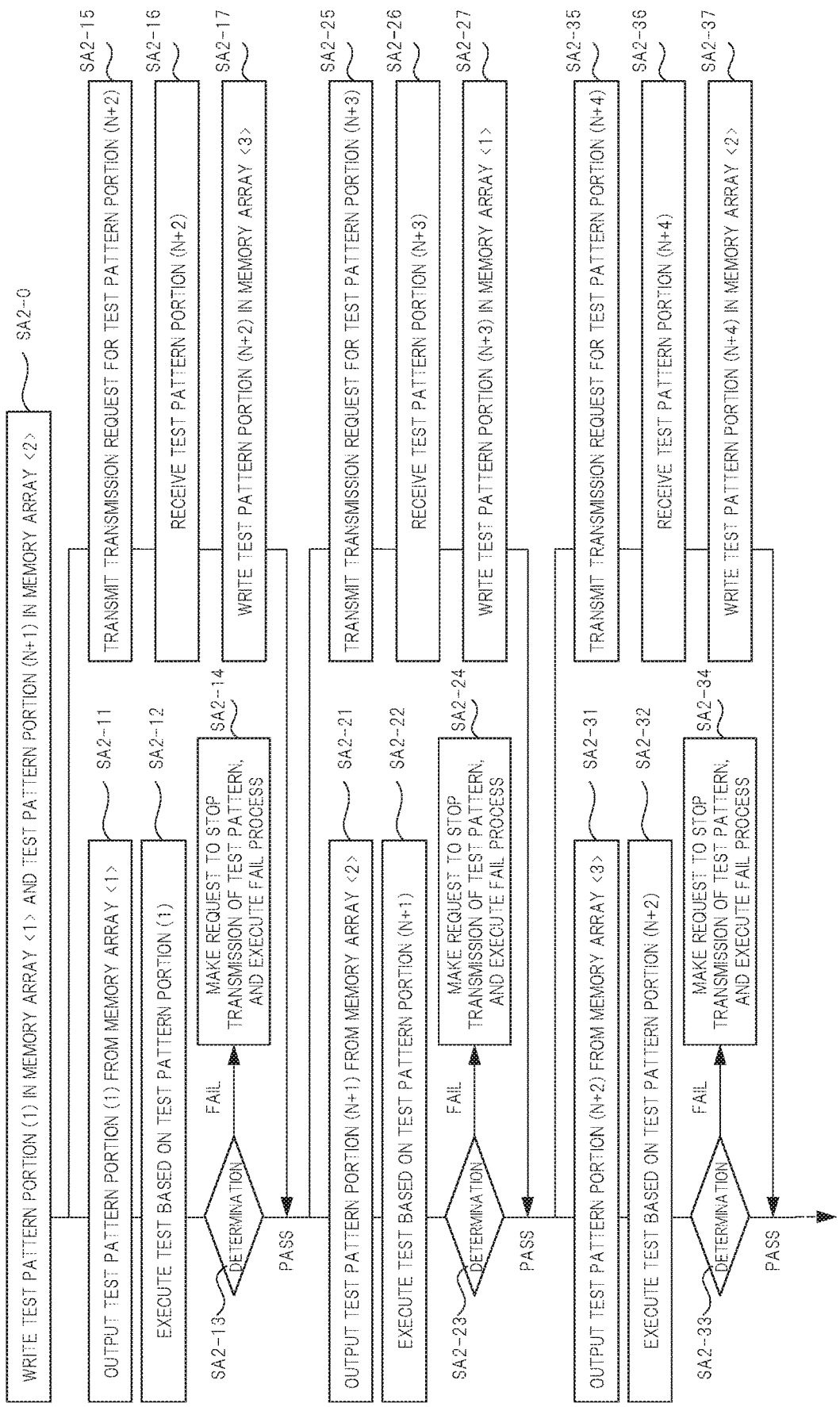
FIG. 16 is a flowchart diagram illustrating operation of a testing device according to a fourth embodiment.

FIG. 16 is a flowchart diagram illustrating operation of a testing device according to a fourth embodiment. As an empirical rule, it is known that, when a semiconductor product is tested with a part of test patterns and results in no fault, the semiconductor product results in no fault even when being tested with the other parts of the test patterns. This empirical rule is applied in the fourth embodiment.

The testing memory server 22 divides a test pattern used for testing the semiconductor product 2 into test pattern portions to form test pattern portions (1) to (N+4). The test pattern portion (1) to the test pattern portion (N+4) are temporally consecutive test patterns in this order. The testing memory server 22 transmits a pattern data portion requested by the testing device from among the test pattern portions (1) to (N+4). Here, a case in which, when the semiconductor product 2 is tested with the test pattern (1) and results in the detection of no fault, the semiconductor product 2 results in the detection of no fault even when being tested with the test pattern portions (2) to (N) on the basis of the empirical rule described above will be described as an example. Of course, this is merely an example, and the present invention is not limited to this.

Since FIG. 16 is similar to FIG. 15, difference therebetween will be mainly described. Step SA2-0 illustrated in FIG. 16 is a step for the pre-test sequence, as with the case of step SA1-0. In step SA1-0, temporally consecutive test pattern portions (1) and (2) are stored in the memory arrays <1> and <2>. On the other hand, in step SA2-0, the test pattern portions (1) and (N+1), which are temporally discontinuous, are stored in the memory arrays <1> and <2>.

Steps SA2-11 to SA2-14 are the same as steps SA1-11 to SA1-14. By the execution of steps SA2-11 to SA2-14, the semiconductor product 2 is tested on the basis of the test pattern portion (1) stored in the memory array <1>. In the case where a fault is found as a result of the test, a request to stop the transmission of the test pattern is transmitted in step SA2-14, and the fault handling process is executed. On the other hand, in the case where there is no fault, step SA2-21 is executed.

In step SA2-21, the temporally discontinuous test pattern portion (N+1) is outputted from the memory array <2> instead of the test pattern portion (2), and the pattern data portion (N+1) of the test pattern portion (N+1) is outputted to the semiconductor product 2. In addition, in step SA2-22, logical comparison is performed between the output data from the semiconductor product 2 corresponding to the test pattern portion (N+1) and the expected pattern data portion (N+1). On the basis of the result of the comparison, the testing processor 10 determines in step SA2-23 whether any fault exists or not. On the basis of the result of the determination, the testing processor 10 executes step SA2-24, step SA2-31, or SA2-35.

On the other hand, in steps SA2-15 to SA2-17, which are executed in temporally parallel with steps SA2-11 to SA2-13, the testing processor 10 transmits a transmission request for the test pattern portion (N+2), which is discontinuous with the test pattern portion (1) and is continuous with the test pattern portion (N+1), to the testing memory server 22, thereby requesting the transmission of the test pattern portion (N+2). By this request, the test pattern portion (N+2) transmitted from the testing memory server 22 is received, and the received test pattern portion (N+2) is written in the memory array <3>.

Furthermore, in steps SA2-25 to SA2-27, which are executed in temporally parallel with steps SA2-21 to SA2-23, the testing processor 10 requests the testing memory server 22 to transmit a test pattern portion (N+3) that is continuous with the test pattern portion (N+2), and writes the received test pattern portion (N+3) in the memory array <1>.

By repeating the operations described above as described in steps SA2-31 to SA2-37, for example, the test for the semiconductor product 2 is executed.

According to the fourth embodiment, during the period of time when the test pattern portions are being outputted from the pattern memory, the pattern memory can be rewritten with a new test pattern portion, and hence, the data capacity required for the pattern memory can be reduced. In addition, in the case where it is determined that there is no fault as a result of a test based on the test pattern portion (1), it is possible to reduce the test pattern portions stored in the pattern memory, and hence, it is possible to reduce the time required for the test.

Effects of the embodiments described above include the following.

(1) It is possible to suppress an increase in the data capacity of an installed memory such as the pattern memory that the testing device includes. This enables to suppress an increase in the data capacity of the installed memory even in the case where the number of transistors mounted in the semiconductor product to be tested increases, and it is thus possible to suppress an increase in price of the testing device. Consequently, it is possible to provide a high-functionality and high-performance semiconductor product while suppressing the cost related to testing.

(2) Since it is possible to improve the fault coverage while suppressing the increase in the data capacity of the installed memory, it is possible to provide a high-quality and high-reliability semiconductor product while suppressing the cost related to testing.

(3) Since it is possible to reduce the number of circuits (for example, expansion circuits and self-generating circuits) installed in the semiconductor product for the purpose of testing, it is possible to suppress an increase in area for semiconductor chips. Consequently, it is possible to suppress an increase in cost of the semiconductor product.

(4) It is possible to reduce or shorten the testing setup time at the time of testing. Therefore, it is possible to reduce the time required for testing. In addition, it is possible to improve the operating ratio of the semiconductor-product testing device.

(5) Since the data capacity of the installed memory can be reduced, it is possible to reduce the price of the testing device, and it is thus possible to reduce the cost required for testing.

(6) Since the data capacity of the installed memory can be reduced, it is possible to reduce the weight and the volume of the test head that is the testing device. This enables to reduce the load applied on the semiconductor product during testing.

In addition, in the case where the testing device (test head) is configured to be movable as illustrated in FIG. 2, since it is possible to reduce the weight of the test head, the test head can be manually handled. As a result, it is possible to eliminate the need of installing a large manipulator, and it is thus possible to improve production efficiency per unit floor area in a factory site.

For example, the weight of the test head can be reduced to approximately 40 kg from approximately 0.5 t, and the rotating portion, which occupies approximately half of the area of a prober, can be reduced to approximately one-third. Thus, it is possible to reduce the occupied area of the prober to approximately two-thirds thereof to improve the production efficiency per unit floor area in the site.

In the first to fourth embodiments, divided pattern data portions and pattern comparison data portions are wirelessly transferred between the testing memory server and the testing device. However, the present invention is not limited to this. Namely, the pattern data portions and the pattern comparison data portions may be transferred through fiber optics or in a wired manner. However, in the case of wireless, data portions can be transferred to a plurality of testing boards substantially at the same time by using a plurality of channels, and time required for testing can be reduced. In addition, since it is possible to prevent an increase in the weight of the test head due to fiber optics or wired lines and connectors connecting them to the testing device, it is possible to further facilitate the handling of the test head, and it is also possible to further improve production efficiency per unit floor area in the site.

Needless to say, semiconductor products in which no fault is detected in the tests described in the first to fourth embodiments are shipped as products.

In the foregoing, the invention made by the inventors of the present invention has been concretely described based on the embodiments. However, it goes without saying that the present invention is not limited to the foregoing embodiments and various modifications and alterations can be made within the scope of the present invention.

What is claimed is:

1. A semiconductor-product testing device that supplies a test pattern for testing a semiconductor product to the semiconductor product, the device comprising:
a pattern memory that stores a part of the test pattern,
wherein the pattern memory is rewritten during a time when the semiconductor product is tested by using the part of the test pattern stored in the pattern memory as a partial test pattern, wherein the pattern memory includes a first address region and a second address region that is different from the first address region, wherein the test pattern includes a plurality of test pattern portions, wherein, during a time when a first test pattern portion stored in the first address region is supplied to the semiconductor product as the partial test pattern and the semiconductor product is tested, a second test pattern portion that is different from the first test pattern portion is written in the second address region, thereby rewriting the pattern memory, and wherein, after testing the semiconductor product by the first test pattern portion stored in the first address region finishes, a third test pattern portion is written in the first address region.

2. The semiconductor-product testing device according to claim 1, wherein the pattern memory includes a third address region that is different from the first address region and the second address region, wherein a fourth test pattern portion supplied to the semiconductor product next to the first test pattern portion is stored in the third address region, and wherein during a time when the fourth test pattern portion stored in the third address region is supplied to the semiconductor product and the semiconductor product is tested, the third test pattern portion is written in the first address region.

3. The semiconductor-product testing device according to claim 1, wherein the first test pattern portion and the second test pattern portion each include a pattern data portion supplied to the semiconductor product and an expected pattern data portion, and wherein the semiconductor-product testing device further comprises:

a comparing unit that outputs a pattern comparison data portion based on output data outputted from the semiconductor product in response to the pattern data portion and the expected pattern data portion; and a fail memory that is rewritten with the pattern comparison data portion outputted from the comparing unit.

4. The semiconductor-product testing device according to claim 3, wherein the fail memory includes a first address region and a second address region which are different from each other, and wherein during a time when the pattern comparison data portion stored in the first address region of the fail memory is outputted, the pattern comparison data portion outputted from the comparing unit is written in the second address region of the fail memory.

5. The semiconductor-product testing device according to claim 4, wherein the first test pattern portion and the second test pattern portion are supplied to the semiconductor-product testing device from a server connected to the semiconductor-product testing device, and wherein the pattern comparison data portion outputted from the fail memory is sequentially supplied to the server.

6. The semiconductor-product testing device according to claim 5, wherein the semiconductor-product testing device and the server are wirelessly connected.

7. A method for testing a semiconductor product, the method comprising:

a test pattern portion storing step of dividing a test pattern for testing a semiconductor product into a plurality of test pattern portions and storing the test pattern portions in a pattern memory; and a test pattern portion supplying of supplying the test pattern portions stored in the pattern memory to the semiconductor product, wherein in the test pattern portion supplying step, during a time when a first test pattern portion stored in the pattern memory is supplied to the semiconductor product, the pattern memory is rewritten with a second test pattern portion supplied later than the first test pattern portion, wherein the pattern memory includes a first address region and a second address region that is different from the first address region, wherein, in the test pattern portion supplying step, during a time when a test pattern portion stored in the first address region is supplied to the semiconductor product as the first test pattern portion, the second test pattern portion is written in the second address region, and wherein, when supplying of the first test pattern portion to the semiconductor product finishes, a third test pattern portion that is different from the first test pattern portion and the second test pattern portion is written in the first address region, wherein the first test pattern portion, the third test pattern portion, and the second test pattern portion include a pattern data portion supplied to the semiconductor product and an expected pattern data portion, and wherein the method further comprises:

a pattern comparison data outputting step of outputting a pattern comparison data portion based on output data outputted from the semiconductor product in response to the pattern data portion and the expected pattern data portion.

8. The method for testing a semiconductor product according to claim 7, wherein the pattern comparison data outputting step includes a fail memory rewriting step of rewriting a fail memory with the pattern comparison data portion, and wherein in the fail memory rewriting step, the pattern comparison data portion is written in the fail memory during a time when the pattern comparison data portion stored in the fail memory is outputted.

9. The method for testing a semiconductor product according to claim 8, wherein the fail memory includes a first address region and a second address region that is different from the first address region, and wherein, during a time when the pattern comparison data portion stored in the first address region is outputted, the pattern comparison data portion is written in the second address region.

10. The method for testing a semiconductor product according to claim 9, wherein the division of the test pattern is performed in a server, and wherein the pattern comparison data portion outputted in the pattern comparison data outputting step is supplied to the server.

11. The method for testing a semiconductor product according to claim 10, wherein the plurality of test pattern portions are supplied wirelessly to a testing device including the pattern memory and the fail memory, and wherein the pattern comparison data portion outputted in the pattern comparison data outputting step is supplied wirelessly from the testing device to the server.

12. A semiconductor product that is tested by the method for testing a semiconductor product according to claim 7.

* * * * *